US006861681B2

(12) United States Patent
Ando et al.

(10) Patent No.: US 6,861,681 B2
(45) Date of Patent: Mar. 1, 2005

(54) ON-P-GAAS SUBSTRATE $ZN_{1-X}MG_XS_YSE_{1-Y}$ PIN PHOTODIODE AND ON-P-GAAS SUBSTRATE $ZN_{1-X}MG_XS_YSE_{1-Y}$ AVALANCHE PHOTODIODE

(75) Inventors: Koshi Ando, Tottori (JP); Tomoki Abe, Tottori (JP); Takao Nakamura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/620,510

(22) Filed: Jul. 16, 2003

(65) Prior Publication Data

US 2004/0038472 A1 Feb. 26, 2004

(30) Foreign Application Priority Data

Aug. 26, 2002 (JP) ....................................... 2002-244795

(51) Int. Cl.[7] ........................................... H01L 31/0328

(52) U.S. Cl. ....................... 257/199; 257/190; 257/103; 257/201; 257/185; 257/186; 257/438; 257/442; 257/461

(58) Field of Search ................................ 257/199, 190, 257/103, 201, 185, 186, 438, 442, 461

(56) References Cited

U.S. PATENT DOCUMENTS

| | | | | |
|---|---|---|---|---|
| 6,121,638 A | * | 9/2000 | Rennie et al. | 257/103 |
| 6,528,395 B2 | | 3/2003 | Nakamura | |
| 2003/0067011 A1 | | 4/2003 | Ando et al. | |

* cited by examiner

*Primary Examiner*—Minhloan Tran
*Assistant Examiner*—Tan Tran
(74) *Attorney, Agent, or Firm*—Fish & Richardson P.C.

(57) ABSTRACT

A blue-ultraviolet on-p-GaAs substrate pin Zn1-xMgxSySe1-y photodiode with high quantum efficiency, small dark current, high reliability and a long lifetime. The ZnMgSSe photodiode has a metallic p-electrode, a p-GaAs single crystal substrate, a p-(ZnSe/ZnTe)m superlattice (m: integer number of sets of thin films), an optionally formed p-ZnSe buffer layer, a p-Zn1-xMgxSySe1-y layer, an i-Zn1-xMgxSySe1-y layer, an n-Zn1-xMgxSySe1-y layer, an n-electrode and an optionally provided antireflection film. Incidence light arrives at the i-layer without passing ZnTe layers. Since the incidence light is not absorbed by ZnTe layers, high quantum efficiency and high sensitivity are obtained.

20 Claims, 17 Drawing Sheets

Embodiment 1

In (φ=0.8mm)
n-electrode
$n^+$-ZnSSe ($2\times10^{19}$ $cm^{-3}$) 44nm
i-ZnSSe 900nm
p-ZnSSe ($3\times10^{17}$ $cm^{-3}$) 450nm
p-ZnSe ($5\times10^{17}$ $cm^{-3}$) buffer layer 30nm
MQW p-ZnSe/p-ZnTe SL 12nm
p-GaAs ($2\times10^{19}$ $cm^{-3}$) substrate
In p-electrode (p-ZnSe)

MQW

| | structure A | structure B |
|---|---|---|
| p-ZnTe | 0.3nm | 0.6nm |
| p-ZnSe | 2.1nm | 2.1nm |
| p-ZnTe | 0.6nm | 0.6nm |
| p-ZnSe | 2.1nm | 2.1nm |
| p-ZnTe | 0.9nm | 1.2nm |
| p-ZnSe | 2.1nm | 2.1nm |
| p-ZnTe | 1.2nm | 1.2nm |
| p-ZnSe | 2.1nm | 2.1nm |
| p-ZnT | 1.5nm | 1.8nm |
| p-ZnSe | 2.1nm | 2.1nm |

(p-GaAs substrate)

Fig. 23

MQW of Embodiment 2

(p-ZnSe)

| p-ZnTe | 0.2nm |
|---|---|
| p-ZnSe | 2.0nm |
| p-ZnTe | 0.4nm |
| p-ZnSe | 2.0nm |
| p-ZnTe | 0.6nm |
| p-ZnSe | 2.0nm |
| p-ZnTe | 0.8nm |
| p-ZnSe | 2.0nm |
| p-ZnTe | 1.0nm |
| p-ZnSe | 2.0nm |

(p-GaAs substrate)

ON-P-GAAS SUBSTRATE $ZN_{1-X}MG_XS_YSE_{1-Y}$ PIN PHOTODIODE AND ON-P-GAAS SUBSTRATE $ZN_{1-X}MG_XS_YSE_{1-Y}$ AVALANCHE PHOTODIODE

BACKGROUND OF THE INVENTION

1. Field of the Invention

This invention relates to ZnSe type pin and avalanche photodiodes having a sensitivity range from ultraviolet rays to blue light. A pin photodiode (pin-PD or PD) is an optoelectronic device having functions of making a strong electric field at a pn junction by applying reverse bias, receiving input light, generating pairs of holes and electrons, accelerating the holes and electrons by the reverse bias and producing photocurrent by the holes and electrons in proportion to power of the input light. An avalanche photodiode (APD) further amplifies flows of carries (electrons and holes) by inducing an avalanche of carriers by a pre-applied large reverse bias.

This application claims the priority of Japanese Patent Application No. 2002-244795 filed on Aug. 26, 2002, which is incorporated herein by reference.

A photodiode has sensitivity for light of a bandgap wavelength λg corresponding to a bandgap Eg of a material of a light receiving layer (active layer) and for light of wavelengths shorter than the bandgap wavelength λg. Here, the bandgap wavelength is defined by an equation of $\lambda g=hc/Eg$ (h is Planck's constant, c is light velocity in vacuum). A photodiode cannot detect light of wavelengths far shorter than the bandgap wavelength λg. Different kinds of photodiodes should be utilized for different wavelength bands of object light. Most prevalent photodiodes are silicon photodiodes (Si-PD) at present. Silicon has a bandgap Eg=1.1 eV and a bandgap wavelength λg=1.1 μm. Silicon photodiodes (Si-PDs) have a wide sensitivity range from visible to near-infrared light ($\lambda \leqq 1.1$ μm). Germanium photodiodes (Ge-PDs) are employed for detecting light of wavelengths longer than the sensitivity range of Si-PDs. Germanium (Ge) has a bandgap Eg=0.67 eV and a bandgap wavelength λg=1.8 μm. Ge-PDs can detect infrared light of wavelengths up to 1600 nm. Si-PDs and Ge-PDs can cover a far wide wavelength range from visible light to infrared light. Besides Si-PDs and Ge-PDs, indium phosphide photodiodes (InP-PDs) which have an InGaAs sensing layer piled upon an InP substrate are utilized for sensing light of a 1.55 μm band and a 1.3 μm band prevailing in optical communications. The three types of photodiodes—Si-PDs, Ge-PDs and InP-PDs—are prevalent. But, these three kinds of photodiodes cover only the wavelength range of the visible light and infrared light. None of the three types of photodiodes has sensitivity for blue, violet and ultraviolet rays. No photodiodes are still available for detecting light of shorter wavelengths. Even silicon photodiodes have poor sensitivity for violet and near-ultraviolet rays.

Reception of violet light and ultraviolet rays requires new photodiodes having an active layer made of a material with a wide bandgap corresponding to object light colors of short wavelengths, blue, violet or ultraviolet.

Gallium nitride (GaN) and zinc selenide (ZnSe) are well known as a wide bandgap material. Gallium nitride (GaN) is an excellent material for blue-light emitting devices (light emitting diodes (LED) and laser diodes (LDs)). GaN has overcome ZnSe as a material for light emitting devices. Gallium nitride (GaN), however, is bad for a material of photodetectors. No good GaN substrate single crystal is obtainable yet at present. If we tried to make a GaN photodiode, we would heteroepitaxially pile GaN-layers on a sapphire substrate. GaN layers grown on a sapphire substrate have many dislocations and defects. An on-sapphire GaN photodiode would be annoyed at poor sensitivity and large dark current due to large defect density.

Zinc selenide (ZnSe) was defeated by GaN in the race of making light producing devices (LEDs or LDs). ZnSe is still promising as a material for making light receiving devices (PDs or APDS) instead of light producing devices. ZnSe has a bandgap wavelength λg=460 nm. λg=460 nm gives ZnSe a possibility of becoming a favorable material for photodiodes for detecting blue light and violet light.

One purpose of the present invention is to provide a ZnSe type photodiode enabling us to detect blue, violet and ultraviolet rays.

2. Description of Related Art

At present, materials which enable us to obtain large single crystal substrates are silicon (Si), germanium (Ge), indium phosphide (InP), gallium arsenide (GaAs) and gallium phosphide (GaP). No large good bulk single crystal of zinc selenide can be grown yet. ZnSe type devices should be built on foreign material substrates. N-type gallium arsenide (GaAs) single crystals have been used as substrates for making ZnSe type devices, since the lattice constant of ZnSe is close to that of GaAs.

Electrons have far higher mobility than holes in GaAs. In general, n-type GaAs wafers have been dominantly used for making optoelectronic devices, for example, photodiodes, light emitting diodes and laser diodes.

On the contrary, p-type GaAs wafers have a poor demand due to small hole mobility. Thus, "GaAs wafers" have indicated n-type GaAs wafers.

We imagine an on-n-GaAs ZnSe photodiode now. If a ZnSe-photodiode were made by piling n-, i- and p-ZnSe-type material layers on an n-GaAs substrate, an imaginary PD would have a metallic n-electrode, an n-GaAs single crystal substrate, an n-ZnSe buffer layer, an n-ZnSe layer, an i-ZnSe layer, a p-ZnSe layer and a metallic p-electrode in series from bottom to top. But, such a ZnSe-PD would not operate with high efficiency.

A drawback is difficulty of making p-type ZnSe. A more serious drawback in the on-n-GaAs ZnSe-PD is that it is impossible to form a p-electrode in ohmic contact with a p-ZnSe layer. The wide bandgap ZnSe prohibits us from forming a metallic p-electrode on p-ZnSe. Zinc telluride (ZnTe) which has a narrower bandgap than ZnSe allows us to make a good p-ZnTe layer and make a good p-electrode upon the p-ZnTe layer. For overcoming the difficulties of the production of p-layers and the formation of p-electrodes on ZnSe, a superlattice of p-ZnSe/ZnTe having a p-ZnTe layer on top is grown on a p-ZnSe layer. Then, a metallic p-electrode is made upon the top p-ZnTe layer. The p-electrode makes an ohmic contact with the undercoating p-ZnTe layer. The metallic p-electrode should be made into an annular shape or a small dotted shape for allowing incidence light to go via the p-electrode into the p-ZnTe layer.

A virtual pn-junction type or pin-junction type ZnSe-photodiode could be made upon an n-type GaAs substrate. An n-metallic electrode as a cathode would be formed upon the n-GaAs substrate. If a reverse bias were applied between the metallic p-electrode (anode) and the bottom n-electrode (cathode), a depletion layer (strong electric field area) would be formed at the i-layer or at the pn-junction. If light beams went into the photodiode and arrived at the depletion layer, photocurrent would be induced. Blue light or violet light could be detected by the photocurrent.

However, such an on-n-GaAs ZnSe photodiode would have the following drawbacks. Incidence light going via an anode (p-electrode) into the photodiode would pass p-type ZnTe layers which are included in a p-ZnTe contact layer and the (ZnTe/ZnSe) superlattice (MQW: multiquantum well). ZnTe which has a bandgap narrower than ZnSe would absorb the incidence light which has energy higher than the ZnTe bandgap. The absorption of the incidence light by the ZnTe layers is one of serious weak points of the on-n-GaAs ZnSe photodiode. A decrease of the light absorption would require thinning of the ZnTe layers. But, the p-ZnTe contact layer would be indispensable for ohmic contact with the p-electrode and the p-ZnTe multiquantum layers would be also necessary for forming the superlattice (MQW) structure. The absorption caused by the p-ZnTe layers would lower external quantum efficiency. Absorption loss induced by the p-ZnTe layers would be more conspicuous for near-ultraviolet rays.

One purpose of the present invention is to provide an on-GaAs ZnSe photodiode with low absorption loss due to ZnTe. Another purpose of the present invention is to provide an on-GaAs ZnSe photodiode with high external quantum efficiency.

SUMMARY OF THE INVENTION

ZnSe type photodiodes of the present invention include a metallic p-electrode, a p-GaAs single crystal substrate, a p-$(ZnSe/ZnTe)^m$ (piles of pair films, m: integer of the number of pair films) superlattice epitaxially grown on the p-GaAs substrate, a p-$Zn_{1-x}Mg_xS_ySe_{1-y}$ layer epitaxially grown on the superlattice, an i-$Zn_{1-x}Mg_xS_ySe_{1-y}$ layer epitaxially grown on the p-$Zn_{1-x}Mg_xS_ySe_{1-y}$ layer, an n- or $n^+$-$Zn_{1-x}Mg_xS_ySe_{1-y}$ layer epitaxially grown on the i-$Zn_{1-x}Mg_xS_ySe_{1-y}$ layer, a metallic n-electrode formed on the n-$Zn_{1-x}Mg_xS_ySe_{1-y}$ layer, and a metallic p-electrode formed on a bottom of the p-GaAs single crystal substrate.

A feature of the present invention is employment of p-GaAs as a substrate. Namely, this invention proposes an on-p-GaAs ZnSe photodiode. In the on-p-GaAs ZnSe photodiode, object light rays enter the photodiode via an n-type layer surface. The direction of incidence light is reverse to the before-mentioned on-n-GaAs substrate ZnSe photodiode. This invention employs a p-GaAs wafer as a starting substrate. The present invention produces a p-type superlattice, p-type layers, an i-type layer, n-type layers in this turn on the p-GaAs substrate. The interposition of the p-superlattice between the p-GaAs substrate and the p-type layers characterizes this invention. An inlet surface is not the p-substrate surface but the top n-layer surface. Incidence light goes via the top n-layers into a pn-junction or pin-junction. The superlattice does not exist in a path from an inlet to an active layer. The superlattice lies under the active layer. The incidence light does not pass the superlattice which is formed under the pn- or pin-junction. The present invention is free from the absorption of the object light by the superlattice including ZnTe.

A metallic n-electrode should be an annular one or a small doted one formed on the top n-layer for allowing incidence light to enter the photodiode via the top n-layer. An extra space on the top layer may be either uncoated or coated with an antireflection film or a protection film.

The photodiode of the present invention has a three-layered nip-structure. A superlattice is formed on a p-GaAs substrate. An nip-layered structure is formed upon the superlattice. All the three n-, i-, p- layers can take ZnSe, $ZnS_ySe_{1-y}$ ($0 \leqq y \leqq 0.8$) or $Zn_{1-x}Mg_xS_ySe_{1-y}$ ($0 \leqq x, y \leqq 0.8$). The mixture ratios x, y are not necessarily common values to all the three layers.

$Zn_{1-x}Mg_xS_ySe_{1-y}$ is reduced to $ZnS_ySe_{1-y}$ for x=0. When x=0 and y=0, $Zn_{1-x}Mg_xS_ySe_{1-y}$ is reduced simply to ZnSe. $Zn_{1-x}Mg_xS_ySe_{1-y}$ is a collective representation including $ZnS_ySe_{1-y}$, $Zn_{1-x}Mg_xSe$ and ZnSe.

An on-p-GaAs pin ZnSe photodiode of the present invention has a layered structure from bottom to top as follows.

1. metallic p-electrode (bottom electrode) Au—PD—Pt, Au—Ti, Au—Pt, or Au
2. p-type substrate p-GaAs substrate
3. p-type superlattice p-$(ZnSe/ZnTe)^m$ (MQW: multiquantum well) (m; integer of the number of sets of layers)
4. p-type layer p-ZnSe, p-ZnSSe, p-ZnMgSSe
5. i-type layer i-ZnSe, i-ZnSSe, i-ZnMgSSe
6. n-type contact layer $n^+$-ZnSe, $n^+$-ZnSSe, $n^+$-ZnMgSSe
7. antireflection film $Al_2O_3$, $SiO_2$, $TiO_2$, $La_2O_3$, $MgF_2$ or set of them
8. top n-electrode Au—In, In, In—Au—Ge The i-layer is a non-doped layer which has the least carrier concentration.

The carrier concentration of the i-layer is equal to or lower than $10^{16}$ $cm^{-3}$. What has the highest carrier concentration is the n-type contact layer. Ohmic contact with the metallic n-electrode requires high carrier concentration for the n-contact layer. A suitable carrier density of the n-contact layer ranges from $n=10^{18}$ $cm^{-3}$ to $10^{20}$ $cm^{-3}$. The p-layers and a buffer p-layer have a carrier concentration of $p=10^{16}$ $cm^{-3}$ to $10^{18}$ $cm^{-3}$. The p-superlattice and the p-GaAs substrate have a carrier concentration of $p=10^{17}$ $cm^{-3}$ to $p=5\times10^{19}$ $cm^{-3}$. The present invention employs nitrogen (N) as a p-dopant and chlorine (Cl) as an n-dopant.

Bandgaps of the n-, i- and p-layers are described. A set of n-, i- and p-layers having the same bandgap is allowable. Namely, the set of n-, i- and p-layers composed of the same components is available. If the n-, i-, p-layers have a common set of components and a common bandgap, the upper n-layer absorbs a part of incident light, which decreases quantum efficiency and sensitivity. The absorption can be reduced by thinning the top n-layers. But, thinning of the n-layers cannot decrease the absorption loss to zero. For avoiding the n-layer absorption, it is effective to increase the bandgap of the top n-layer (an n-window layer). Use of quaternary components enables us to enlarge the bandgap of the n-layer by changing a mixture rate. An increase of a Mg rate or an S rate to Se raises the bandgap of the n-layer.

Two cases are available for selecting bandgaps Ep, Ei and En of the p-, i- and n-layers.

(1) Common Bandgap Case Ep=Ei=En

All the three layers have a common bandgap. In the common bandgap case, all the n-, i-, p-layers can be made of ZnSe. Otherwise, all the three layers can be made of ZnSSe of the same rate. Or the three layers can be formed of ZnMgSSe.

(2) Different Bandgap Case En>Ei=Ep

The n-layer has a bandgap larger than the bandgap of the i-layer and the p-layer. An allowable set has an n-layer made of ZnSSe and a p-layer and an i-layer made of ZnSe. Otherwise, an i-layer and a p-layer are ZnSSe and an n-layer is ZnMgSSe.

For obtaining enough sensitivity up to near-ultraviolet (about 300 nm), the sensing layer (i-ZnMgSSe layer) should have a Mg rate of more than 0.1 and a S rate of more than 0.1 ($0.1 \leqq x$, $0.1 \leqq y$; in $Zn_{1-x}Mg_xS_ySe_{1-y}$). For example, an i-$Zn_{0.9}Mg_{0.1}S_{0.1}Se_{0.9}$ layer can build a ZnSe type photodiode with high sensitivity for 300 nm.

As mentioned before, the on-n-GaAs ZnSe PD, which would be made by piling an n-layer, an i-layer, a p-layer, p-$(ZnTe/ZnSe)^m$ superlattice and a —ZnTe contact layer on an n-GaAs substrate, would be annoyed by poor quantum efficiency, because the upper p-ZnSe layers in the superlattice and in the contact layer would absorb incidence light. The top superlattice would be indispensable for alleviating the energy gap between the top p-ZnTe contact layer and the p-ZnSe layer in the on-n-GaAs ZnSe PD. Without the p-$(ZnTe/ZnSe)^m$ superlattice, photocurrent could not flow by the energy gap.

Instead of the n-GaAs substrate, the present invention starts from a p-GaAs substrate and grows p-, i-, n-ZnMgSSe layers in this turn upon the p-GaAs substrate. Use of an n-ZnSe contact layer has a merit of establishing an ohmic contact n-electrode with a pertinent metal, for example, indium as an n-electrode. There is no p-$(ZnTe/ZnSe)^m$ superlattice on the top of the nip/p-GaAs PD. Since incidence light coming via a top n-layer does not pass the p-$(ZnTe/ZnSe)^m$ superlattice containing ZnTe, no absorption loss occurs in the present invention.

However, the present invention does not choose a simple on-p-GaAs substrate structure having a bottom p-GaAs substrate and p-, n-, or p-, i-, n-ZnMgSSe layers on the p-GaAs substrate. The inventors of the present invention actually had made such a primitive on-p-GaAs PD and had examined the prototype on-p-GaAs PD.

The inventors of the present invention noticed that the simple on-GaAs ZnSe photodiode having p-, n-, or p-, i-, n-ZnMgSSe layers on a p-GaAs substrate was inoperative.

The prototype ZnSe photodiode the inventors had produced and examined was a ZnSe photodiode having a p-GaAs substrate, p-, n-, or p-, i-, n-ZnSe layers grown directly in series on the p-GaAs substrate, an n-electrode on the n-ZnSe and a p-electrode formed on a bottom of the p-GaAs substrate. A serious problem had occurred in a forward voltage/current performance. When a forward voltage of 5 V to 10 V was applied to the prototype PD, little current flows in a forward direction. The forward current means a current which flows from a p-electrode (anode) via p-GaAs and n-ZnSe to an n-electrode (cathode). In the prototype photodiode, unless a forward voltage bigger than 5V to 10V was applied, no forward current flowed. Namely, rectifying property which is one of the significant properties of diodes was insufficient.

The inventors had sought the reason of inducing the poor forward current. The inventors had noticed that a large barrier was made at an interface between the p-GaAs and the p-ZnSe layer and the ZnSe/GaAs barrier stopped a flow of holes across the interface. GaAs has a bandgap different from ZnSe. The difference of the bandgap makes a large barrier at the GaAs/ZnSe interface.

The inventors have hit upon an idea of interposing a superlattice which piles ZnSe/ZnTe layers in turn at the ZnSe/GaAs interface for annihilating the ZnSe/GaAs barrier. The ZnSe/ZnTe superlattice is an assembly of thin ZnSe films and ZnTe thin films reciprocally piled in turn. Here, the superlattice is denoted by $(ZnSe/ZnTe)^m$, where m is an integer for denoting the number of pairs of ZnSe and ZnTe films. Thicknesses of the thin films change stepwise. A suitable example of the superlattice will be described later. The $(ZnSe/ZnTe)^m$ superlattice enables holes to run smoothly through the superlattice as tunnel current. The inventors found that the $(ZnSe/ZnTe)^m$ superlattice can solve the difficulty of the ZnSe/GaAs barrier. A gist of the present invention is the interposition of the superlattice between the p-GaAs substrate and the p-$Zn_{1-x}Mg_xS_ySe_{1-y}$ layer.

Incidence light enters via an n-side aperture made on a part of the n-layer. (Another part of the n-layer is covered with the n-electrode.) Optionally an antireflection film or a transparent protection film is formed on the n-side aperture. Transparent, rigid films, for example, $Al_2O_3$, $SiO_2$, $TiO_2$, $La_2O_3$ or $MgF_2$ films, are suitable for protection or antireflection films. An antireflection film is made of a pile of different dielectric thin films with pertinent refractive indices and thicknesses. A simple antireflection film can be made by piling a single dielectric film having a ¼n thickness on the n-side aperture. Here, "n" is a refractive index of the film.

The present invention has a fundamental structure of PIN/superlattice/p-GaAs junction. The fundamental structure can be commonly applied to an avalanche photodiode (APD), which has the following structure.

1. p-side metallic electrode (bottom) Au-PD—Pt, Au—Pt, Au—Ti, Au
2. p-type substrate p-GaAs
3. p-superlattice (MQW: multiquantum well) p-$(ZnSe/ZnTe)^m$ (m: paring layer number)
4. p-layer p-ZnSe, p-ZnSSe, p-ZnMgSSe
5. $n^-$-layer $n^-$-ZnSe, $n^-$-ZnSSe, $n^-$-ZnMgSSe
6. $n^+$-contact layer $n^+$-ZnSe, $n^+$-ZnSSe, $n^+$-ZnMgSSe
7. antireflection film (optional) $Al_2O_3$, $SiO_2$, $TiO_2$, $La_2O_3$, $MgF_2$ or set of them
8. n-side metallic electrode (top) Au—In, In, In—Au—Ge The avalanche photodiode is illustrated in FIG. 18. In the avalanche diode, a strong reverse bias is applied between an anode (p-electrode) and a cathode (n-electrode) for inducing avalanche amplification. The strong bias makes a strong electric field at the pn-junction. The strong electric field makes a wide depletion layer in the vicinity of the pn-junction. In this case of $n^-$-avalanche layer, the depletion layer is mainly produced in the lower doped $n^-$-layer. An increase of the reverse bias raises the breadth of the depletion layer. Incidence light generates pairs of electrons and holes in the $n^-$-depletion layer. The holes which are minority carriers are accelerated by the reverse bias voltage. The rapid holes collide with lattice atoms and extract holes and electrons. New carriers are accelerated and make further new carriers. An avalanche amplification takes place in the $n^-$-layer. Optionally, an additional thin i-layer can be interposed between 4.p-layer and 5.$n^-$-layer. The i-layer has an effect of lowering and stabilizing dark current by improving performance of crystallographic property of the pn-interface. Otherwise, it is also advantageous to insert a p-ZnSe buffer layer between 3.superlattice and 4.p-layer. The inserted buffer layer should be made at a lower temperature than the temperature at which other layers are epitaxially grown. The low-temperature grown buffer layer enhances a crystallographical quality of $Zn_{1-x}Mg_xS_ySe_{1-y}$ layers grown upon the buffer layer.

[Bandgap and Lattice Constant of $Zn_{1-x}Mg_xS_ySe_{1-y}$ Quaternary Mixture Crystals]

This invention employs ZnSe type crystals as n-, i-, p-layers ("nip-" abbr.) which should be grown on a p-GaAs substrate crystal. The nip-ZnSe type crystals mean not only ZnSe itself but also ZnSe-like mixture crystals having wider bandgaps than ZnSe. Nip-layers should satisfy lattice fitting with GaAs. Namely, the lattice constants of the nip-layers should be nearly equal to the lattice constant of GaAs. FIG. 1 is a graph showing the relation between the lattice constants and bandgaps of II–VI (2–6) group compounds. The abscissa is lattice constants (nm). The left ordinate is bandgap energy (eV). The right ordinate denotes absorption edge wavelengths (nm). Round dots mean compounds of II–VI group. A rhombus formed by ZnSe, ZnS, MgS and MgSe is depicted at a central portion. ZnSe has a bandgap of 2.68 eV (460 nm) and a lattice constant of 0.5668 nm. The ZnSe lattice constant is nearly equal to GaAs. A transition ($Zn_{1-x}Mg_xSe$) from ZnSe to MgSe increases both lattice constants and bandgaps. MgS has a 270 nm absorption edge wavelength which is the shortest in all $Zn_{1-x}Mg_xS_ySe_{1-y}$ mixtures.

Another transition ($ZnS_ySe_{1-y}$) from ZnSe to ZnS decreases lattice constants but increases bandgap energies. The ZnSe—ZnS transition is not linear. ZnS has an absorption edge wavelength of about 340 nm. The lattice constant of ZnS is smaller than ZnSe. MgS has a bandgap (4.5 eV) larger than ZnS and MgSe. The lattice constant of MgS is about 0.56 nm which is akin to GaAs. All materials included within the rhombus correspond to quaternary compounds $Zn_{1-x}Mg_xS_ySe_{1-y}$ which include two parameters x and y showing mixture rates. Sometimes, $Zn_{1-x}Mg_xS_ySe_{1-y}$ is abbreviated to ZnMgSSe by omitting the representation of mixture rates x and y.

GaAs is designated by a point [A] just below the rhombus in FIG. 1. GaAs has a 0.56 nm lattice constant and a bandgap of 1.42 eV. An extension of a line connecting ZnSe and MgS coincides with the GaAs lattice constant line of 0.56 nm. The quaternary compounds $Zn_{1-x}Mg_xS_ySe_{1-y}$ have a potential for changing bandgap energy from 2.5 eV (ZnSe) to 4.5 eV (MgS) under the restriction of the lattice matching with GaAs. This is an advantageous feature of $Zn_{1-x}Mg_xS_ySe_{1-y}$ type crystals. ZnSe type photodiodes of the present invention can choose ZnSe, ZnSSe, ZnMgSe or ZnMgSSe as nip-layers. The range of suitable mixtures is $0 \leqq x \leqq 0.8$ and $0 \leqq y \leqq 0.8$.

This invention proposes an on-p-GaAs ZnSe type pin-photodiode which is produced by piling a p-ZnSe/ZnTe-SL (MQW), a p-ZnMgSSe layer, an i-ZnMgSSe layer and an n-ZnMgSSe layer in series on a GaAs substrate and an on-p-GaAs ZnSe type avalanche photodiode which is produced by piling a p-ZnSe/ZnTe-MQW, a p-ZnMgSSe layer, an $n^-$-ZnMgSSe layer and an $n^+$-ZnMgSSe layer in series on a GaAs substrate. The present invention overcomes the weak point of Si-PDs (poor sensitivity for blue to ultraviolet) and the drawback of on-sapphire GaN-PDs (large dark current induced by big lattice misfitting). Furthermore, this invention solves the difficulty of an on-n-GaAs ZnSe PD (low quantum efficiency caused by absorption of ZnTe layers). The pin-PD and APD of the present invention have advantages of good quantum efficiency, high sensitivity for blue/ultraviolet, high reliability, low dark current and long lifetime.

BRIEF DESCRIPTION OF THE DRAWINGS

FIG. 23 is a sectional view of a ZnSe/ZnTe superlattice (MQW) structure of an on-p-GaAs substrate ZnSSe photodiode of Embodiment 2 of the present invention.

DETAILED DESCRIPTION OF THE PREFERRED EMBODIMENTS

The present invention makes a ZnSe-type photodiode upon a $(ZnTe/ZnSe)^m$ superlattice (MQW) formed upon a p-GaAs substrate. The $(ZnTe/ZnSe)^m$ superlattice excludes occurrence of a barrier between GaAs and ZnSe which impedes holes from flowing from GaAs to ZnSe in a forward direction. Without the $(ZnTe/ZnSe)^m$ superlattice, a barrier stops holes. No practical on-p-GaAs photodiode can be produced due to the (ZnSe/GaAs) barrier. A comparison example without superlattice is produced as Comparison example 1 for clarifying effects of a superlattice included in a photodiode (Embodiment 1) of the present invention.

[Structure of a ZnSe-Type Photodiode of Embodiment 1 (FIG. 2)]

Figure 2:
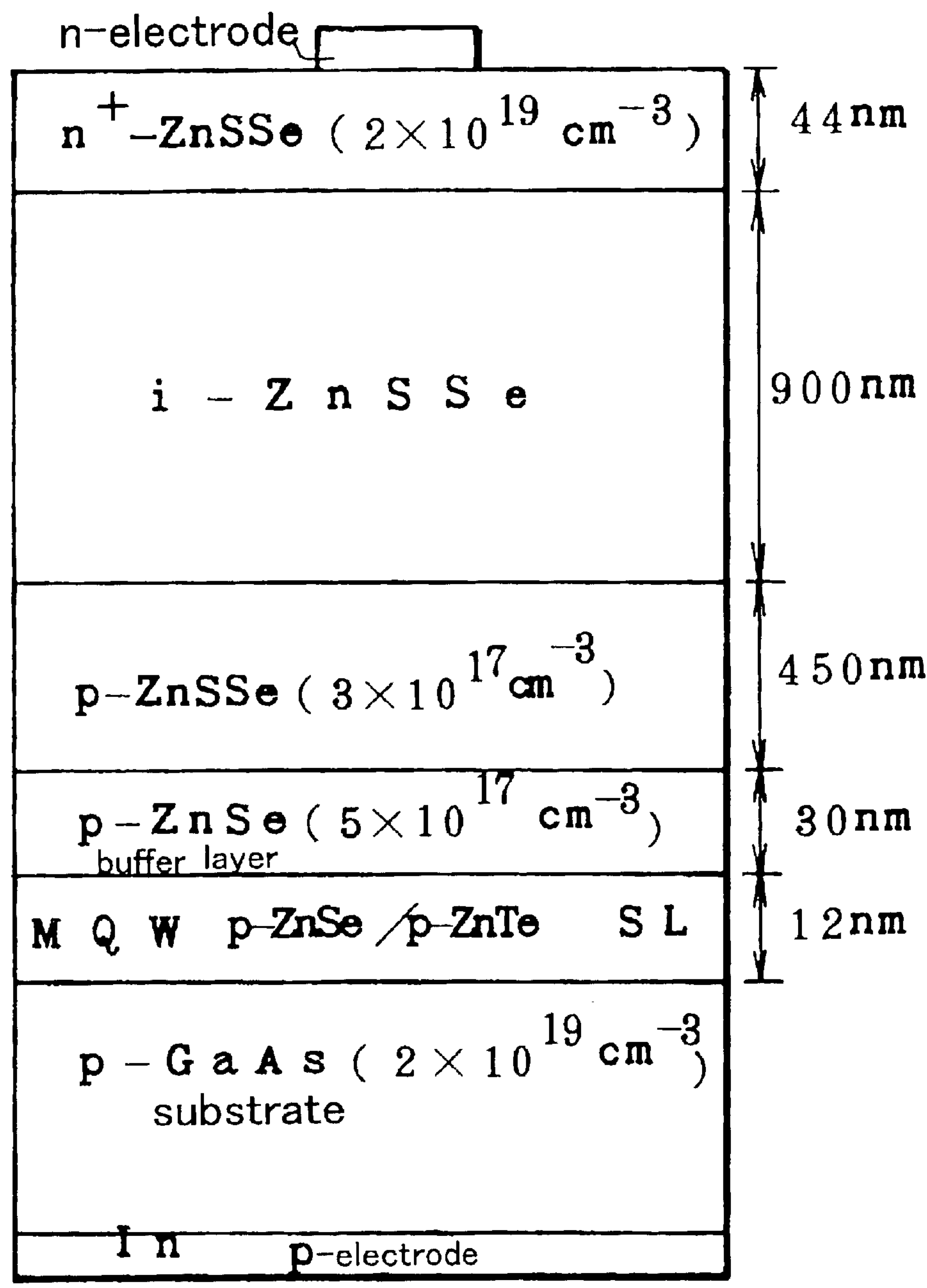
FIG. 2 is a sectional view of an on p-GaAs/ZnSe-photodiode of Embodiment 1 of the present invention. Embodiment 1 interposes a p-ZnTe/ZnSe-MQW between a p-type GaAs substrate and a p-type ZnSe buffer layer.

FIG. 2 shows a layered structure of a $Zn_{1-x}Mg_xS_ySe_{1-y}$ photodiode of Embodiment 1 from top to bottom.

| | | |
|---|---|---|
| n-electrode | indium (In) dotted shape | φ = 0.8 mm |
| $n^+$-ZnSSe | n = 2 × $10^{19}$ $cm^{-3}$ | thickness 44 nm |
| i-ZnSSe | n < $10^{16}$ $cm^{-3}$ | thickness 900 nm |
| p-ZnSSe | p = 3 × $10^{17}$ $cm^{-3}$ | thickness 450 nm |
| p-ZnSe (buffer) | p = 5 × $10^{17}$ $cm^{-3}$ | thickness 30 nm |
| p-$(ZnSe/ZnTe)^m$ | MQW | total thickness 12 nm |
| p-GaAs substrate | p = 2 × $10^{19}$ $cm^{-3}$ | |
| p-electrode | indium (In) (allover) | |

The mixture ratio is x=0 and y=0.055 in Embodiment 1. All n-, i- and p-layers are triplet compounds $ZnS_{0.055}Se_{0.945}$. The 900 nm thick i-ZnSSe layer is a non-doped layer. The carrier concentration is less than $10^{15}$ $cm^{-3}$ (n<$10^{16}$ $cm^{-3}$). Thus, the i-layer is a depletion layer. The thickest i-ZnSSe layer acts as an active layer which absorbs blue light and ultraviolet rays and produces pairs of holes and electrons. Application of a reverse bias widens the depletion layer beyond the i-layer slightly inward to the p-layer.

[Structure of a ZnSe-Type Photodiode of Comparison Example 1 (FIG. 3)]

Figure 3:
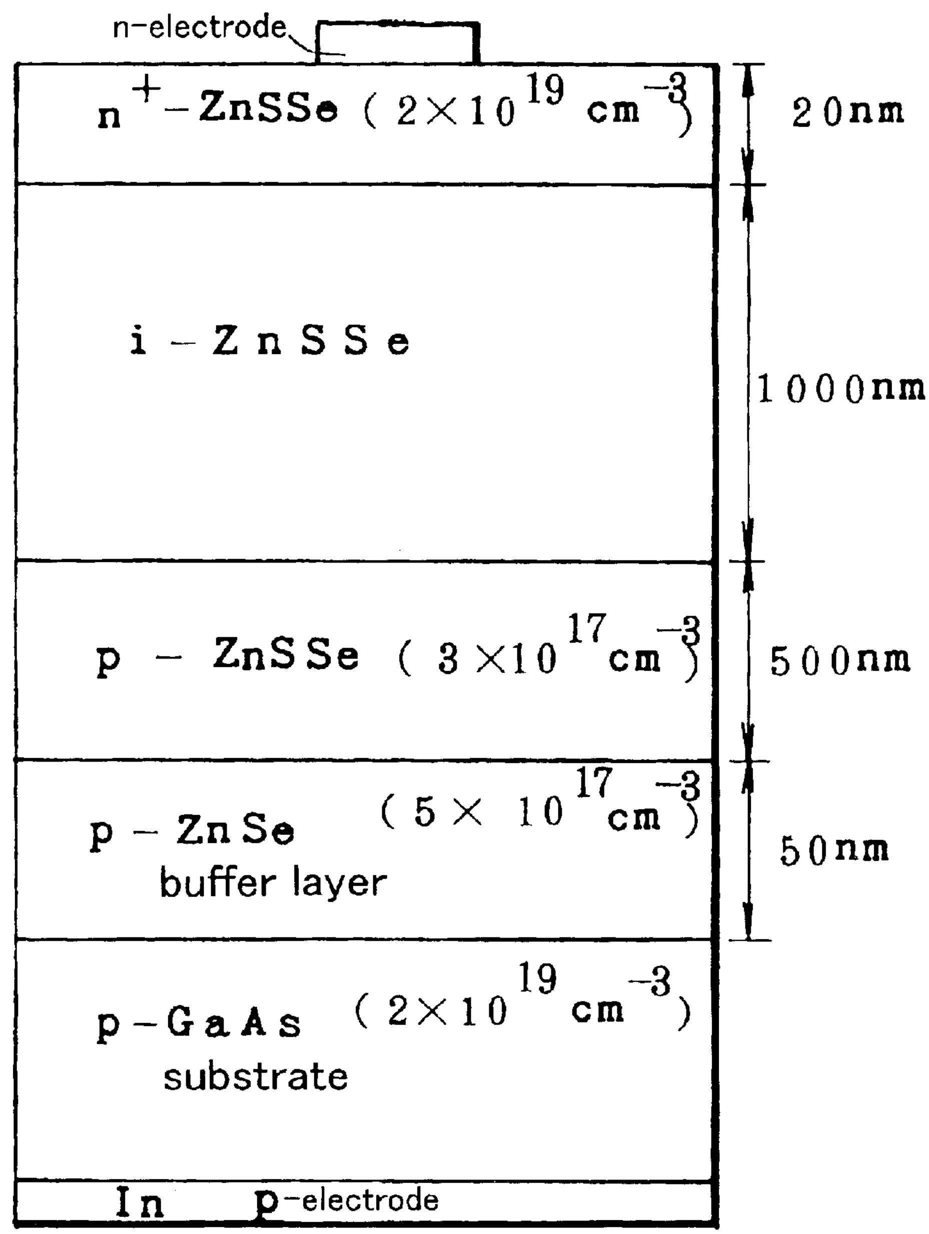
FIG. 3 is a sectional view of an on p-GaAs/ZnSe-photodiode of a comparison example 1 which lacks a p-ZnTe/ZnSe-MQW between a p-type GaAs substrate and a p-type ZnSe buffer layer and brings a p-ZnSe buffer layer in direct contact with a p-type GaAs substrate.

Comparison Example 1 (not prior art) the inventors made has a layered structure from top to bottom as shown in FIG. 3.

| | | |
|---|---|---|
| n-electrode | indium (In) dotted shape | φ = 1.0 mm |
| $n^+$-ZnSSe | n = 2 × $10^{19}$ $cm^{-3}$ | thickness 20 nm |
| i-ZnSSe | n < $10^{16}$ $cm^{-3}$ | thickness 1000 nm |
| p-ZnSSe | p = 3 × $10^{17}$ $cm^{-3}$ | thickness 500 nm |
| p-ZnSe (buffer) | p = 5 × $10^{17}$ $cm^{-3}$ | thickness 50 nm |
| p-GaAs substrate | p = 2 × $10^{19}$ $cm^{-3}$ | |
| p-electrode | indium (In) (allover) | |

Comparison Example 1 is not prior art. Thicknesses are slightly different from Embodiment 1. A large difference is omission of the (ZnSe/ZnTe) superlattice. The mixture rate of Comparison Example 1 is y=0.055 which is the same as Embodiment 1.

[Forward Voltage/Current Performance of Embodiment 1 and Comparison Example 1 (FIG. 4 and FIG. 5)]

Figure 4:
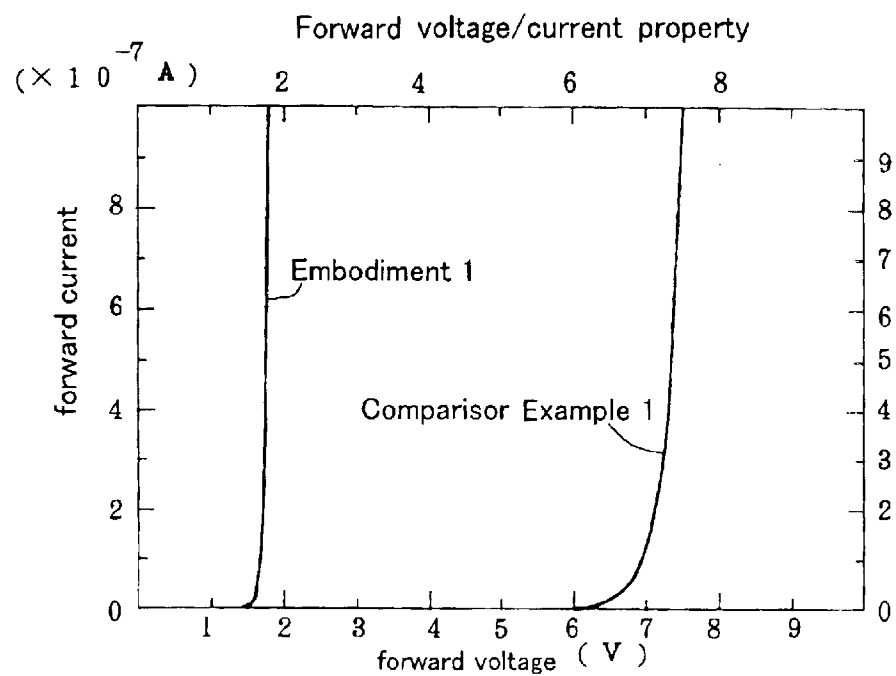
FIG. 4 is a graph showing forward currents in a range of $10^{-7}$ A to $10^{-6}$ A as a function of forward voltages of ZnSe-photodiodes of Embodiment 1 and Comparison Example 1. The abscissa is a forward voltage. The ordinate is a forward current.
Figure 5:
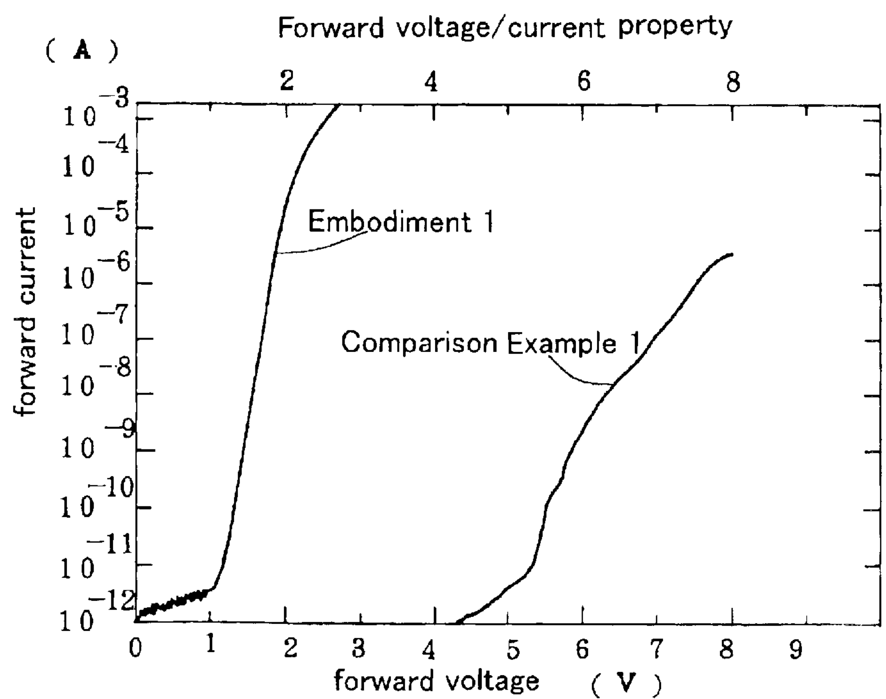
FIG. 5 is a graph showing forward currents in a logarithmic scale in a range of $10^{-12}$ A to $10^{-3}$ A as a function of forward voltages of ZnSe-photodiodes of Embodiment 1 and Comparison Example 1. The abscissa is a forward voltage. The ordinate is a forward current.

FIG. 4 and FIG. 5 denote forward voltage/current properties of the ZnSe-PDs of Embodiment 1 and Comparison Example 1. FIG. 4 shows a partial range between $10^{17}$ A and $10^{-6}$ A of the forward current graph. The abscissa is forward voltages (V). The ordinate is forward currents (×$10^{-7}$ A). A left branch shows a measured result of Embodiment 1. A right branch shows a measured result of Comparison Example 1. Embodiment 1 takes forward current between $10^{-7}$ A and $10^{-6}$ A for forward voltage from 1.6V to 1.8V. On the contrary, Comparison Example 1 gives the same range (between $10^{-7}$ A and $10^{-6}$ A) of forward current for forward voltage from 6 V to 7.5V which is far larger than Embodiment 1.

FIG. 5 shows a wide range of forward currents from $10^{-12}$ A to $10^{-3}$ A. The abscissa is forward voltage (V). The ordinate is forward current in a logarithmic scale.

A left branch denotes the property of Embodiment 1 in FIG. 5. 0V forward voltage induces $10^{-12}$ A forward current. 1.2V forward voltage gives 4×$10^{-12}$ A forward current. The forward current rises rapidly then. 2V forward voltage increases forward current up to $10^{-4}$ A. Embodiment 1 exhibits a good forward current performance.

A right branch shows Comparison Example 1 in FIG. 5. No forward current flows for forward voltage from 0V to 4V. Comparison Example 1 has a high barrier for forward current. 5V forward voltage yields 4×$10^{-12}$ A of forward current. 6V forward voltage induces 4×$10^{-9}$ A forward current. 8V forward voltage makes 4×$10^{-6}$ A forward current. A rising voltage is high. A rising current curve is slow. Comparison Example 1 lacks good diode property. The bad diode property (poor rectifying property) would originate from the barrier between GaAs and ZnSe. Embodiment 1 raises forward current rapidly at a low voltage. Embodiment 1 farther surpasses Comparison Example 1 in the diode property. The large and rapid rising forward current results from the ZnSe/ZnTe multiquantum well which is interposed between GaAs and ZnSe. The good diode property of Embodiment 1 is an excellent advantage which enables us to make practical photodiodes for ultraviolet and blue light.

[External Quantum Efficiency of ZnSSe Type Photodiodes of Embodiment 1 (FIG. 6)]

Figure 6:
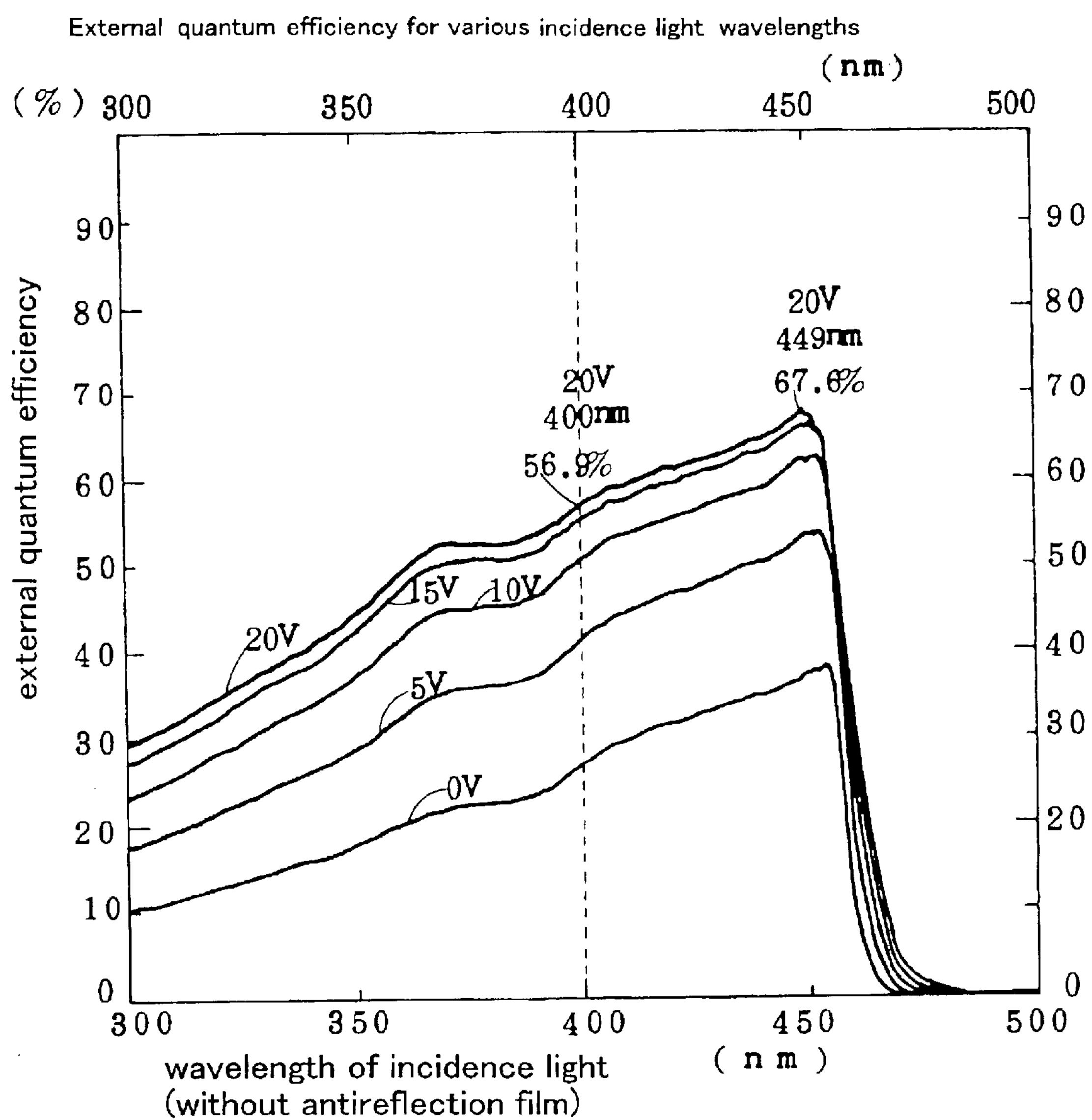
FIG. 6 is a graph showing the dependence of external quantum efficiency upon wavelengths for parameters of reverse biases of the ZnSe-photodiode of Embodiment 1. The abscissa denotes a wavelength (nm), and the ordinate denotes external quantum efficiency.

FIG. 6 shows wavelength dependence of external quantum efficiency of ZnSSe photodiodes of Embodiment 1. Affixed parameters show reverse biases (0V, −5V, −10V, −15V and −20V). The abscissa is wavelengths (nm) of incidence light in a range between 300 nm and 500 nm. The ordinate is external quantum efficiencies (%). Embodiment 1 has no antireflection film on the top aperture. An addition of an antireflection film raises the external quantum efficiencies by 10% to 15%. Even without bias, external quantum efficiency is 38% at a 450 nm wavelength. A −5V reverse bias enhances external quantum efficiency up to 53% at 450 nm. An increase of reverse bias raises external quantum efficiency. A −20V reverse bias allows external efficiency to take a maximum 67.6% at 449 nm light. External quantum efficiency for 400 nm light by a −20V reverse bias is 56.9%. High external quantum efficiency is equivalent to high sensitivity for the light in the wavelength range. High external quantum efficiencies in the range between 300 nm and 450 nm show excellency of the ZnSe-type PD of Embodiment 1 as a violet/blue photodiode. The high external quantum efficiency originates from non-existence of a ZnTe layer and an MQW having ZnTe in an upper part above the sensing i-layer. Incidence light arrives at the sensing i-layer without passing absorptive ZnTe layers. No absorption by ZnTe layers occurs in Embodiment 1. Since object light enters via n-layers which need not interpolated ZnTe, incidence light can reach the sensing layer without absorption by ZnTe. The quantum efficiency is raised by excluding absorption by ZnTe layers in the present invention.

[Comparison of Dark Currents of Embodiment 1 with Other Photodiodes (FIG. 7)]

Figure 7:
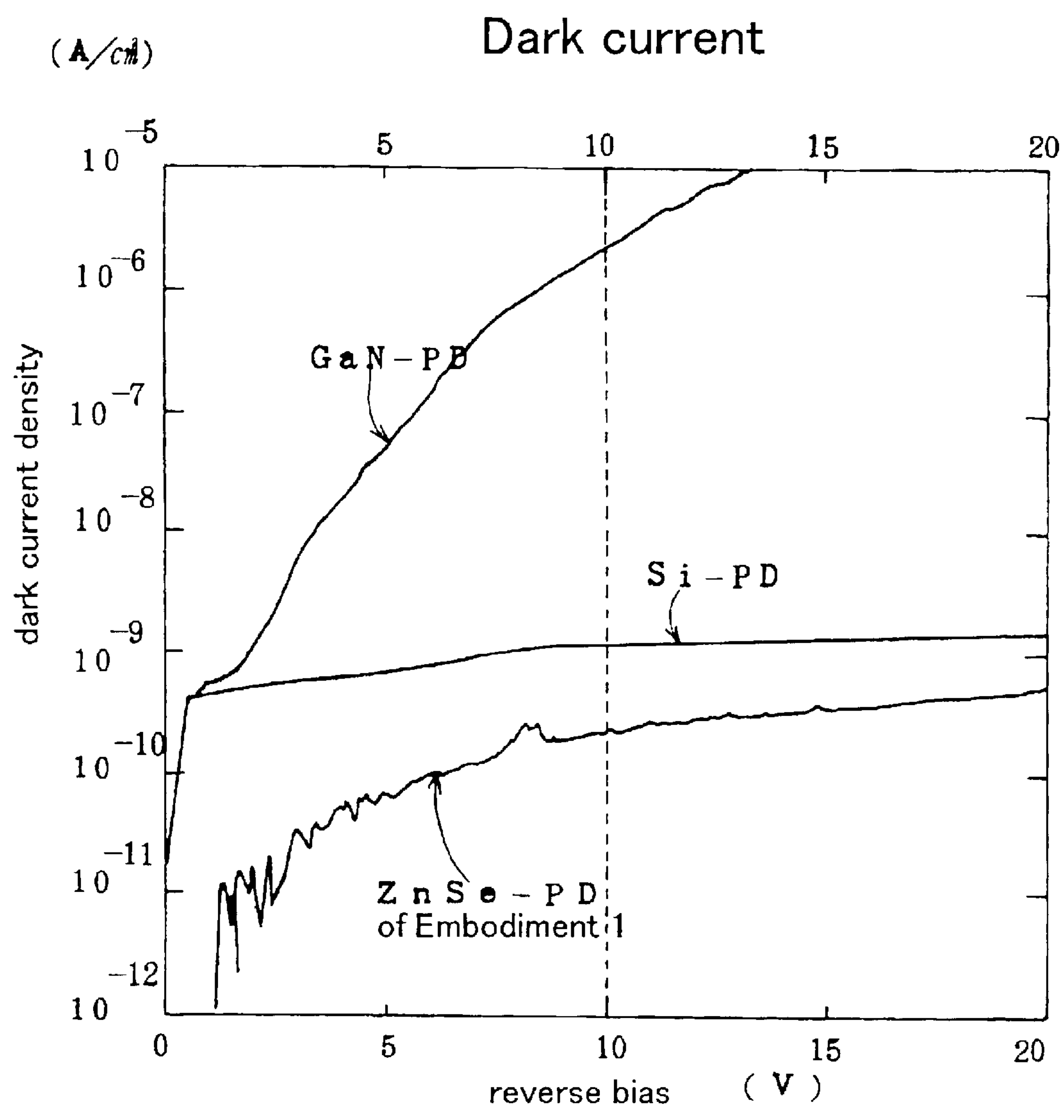
FIG. 7 is a graph showing changes of dark currents of a ZnSe-PD, a GaN-PD and a Si-PD as a function of reverse biases at room temperature. An abscissa is a reverse bias (V). An ordinate is dark current density ($A/cm^2$).

Low dark current is another advantage of the present invention. FIG. 7 shows dark currents of a GaN-PD, a Si-PD a ZnSe-PD (the present invention) as a function of reverse biases. The GaN-PD which has sensitivity for ultraviolet has a large dark current. A reverse bias of 10V induces a large dark current of $2\times10^{-6}/cm^2$ in the GaN-PD. When 13V of reverse bias is applied, $10^{-5}$ $A/cm^2$ dark current flows. Since a large GaN substrate single crystal is not obtainable, a sapphire single crystal is used for a substrate of the GaN-PDs. Lattice-misfitting induces a high dislocation density and causes a large dark current. The GaN-PDs cannot be used as a high sensitivity photodetector due to the big dark current. A silicon photodiode (Si-PD) has nearly constant dark current ranging from $5\times10^{-10}$ $A/cm^2$ to $2\times10^{-9}$ $A/cm^2$ for reverse biases from 1V to 20V. The Si-PD has poor sensitivity for violet and ultraviolet because of the narrow bandgap. The Si-PD is ineffective for detecting violet or ultraviolet rays despite small dark current.

The ZnSe-type photodiodes of Embodiment 1 has a good dark current property. For 5V of reverse bias, dark current is very small ($7\times10^{-11}$ $A/cm^2$). 10V of reverse bias causes $2\times10^{-10}$ $A/cm^2$. At 20V reverse bias, dark current of the ZnSe-PD is smaller than the Si-PD. The ZnSe-photodiode of the present invention is excellent in the external quantum efficiency and the dark current.

[Structure of ZnSSe Type Photodiode of Embodiment 2 (Antireflection Film)]

| | | |
|---|---|---|
| n-electrode | indium (In) dot-shape | φ = 1.0 mm |
| antireflection film (AR) | $TiO_2/SiO_2$ layers | thickness 60 nm |
| $n^+$-ZnSSe | $n = 2 \times 10^{19}$ $cm^{-3}$ | thickness 44 nm |
| i-ZnSSe | $n < 10^{15}$ $cm^{-3}$ | thickness 9000 nm |
| p-ZnSSe | $p = 3 \times 10^{17}$ $cm^{-3}$ | thickness 450 nm |
| p-ZnSe | $p = 5 \times 10^{17}$ $cm^{-3}$ buffer | thickness 30 nm |
| p-ZnSe/ZnTe | MQW | thickness 13.5 nm |
| p-GaAs substrate | $p = 2 \times 10^{19}$ $cm^{-3}$ | |
| p-metallic electrode | indium (In) | |

Figure 1:
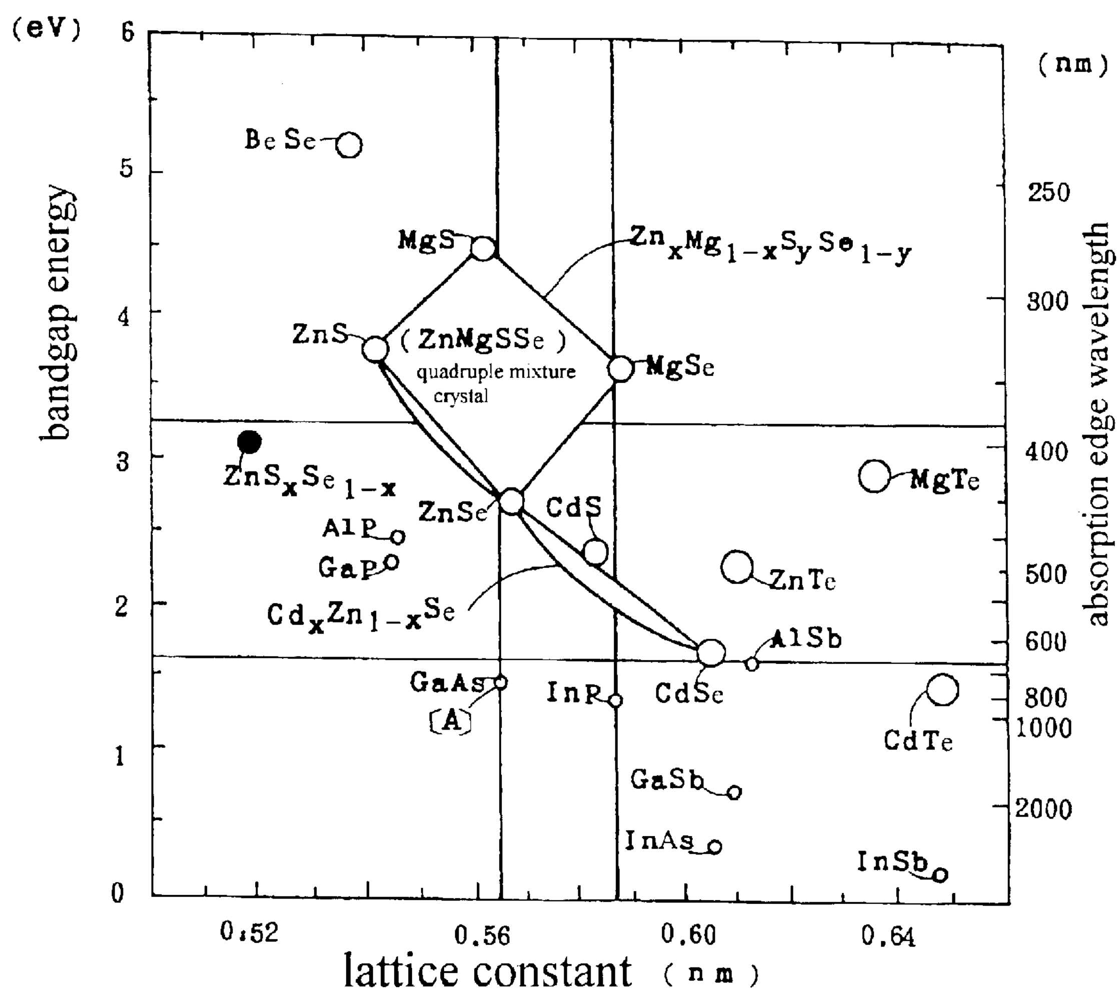
FIG. 1 is a bandgap/lattice diagram for showing relations between lattice constants and bandgap energy of ZnMgSSe-type quaternary component mixture crystals.

Embodiment 2 forms a 60 nm thick $TiO_2/SiO_2$ antireflection film on a top aperture in addition to the structure of Embodiment 1. Embodiment 2 is similar to Embodiment 1 (FIG. 1) except the antireflection film around the In n-electrode. Thus, Embodiment 2 is not shown in a figure. The superlattice has five pairs of p-ZnTe/ZnSe layers. Namely, the superlattice is denoted by p-$(ZnTe/ZnSe)^5$. All five p-ZnSe layers have a 2 nm thickness in common. But, five p-ZnTe layers have thicknesses of 0.2 nm, 0.4 nm, 0.6 nm, 0.8 nm and 1.0 nm from top to bottom respectively as illustrated in FIG. 23.

Figure 12:
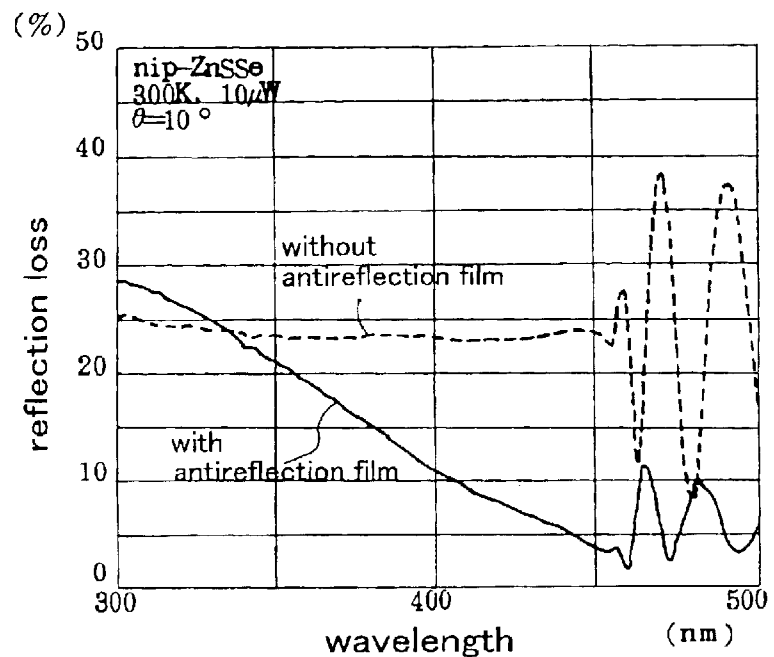
FIG. 12 is a graph showing a result of experiments of reflection loss of ZnSSe-PDs of Embodiment 1 (without antireflection film) and Embodiment 2 (with antireflection film) as a function of wavelengths of light. The ordinate is a reflection loss (%). The abscissa is a wavelength (nm) of incident light. Embodiment 2 with an antireflection film enjoys lower reflection loss than Embodiment 1 without an antireflection film.

Properties of Embodiment 1 (without antireflection AR film) and Embodiment 2 (with antireflection AR film) are compared. FIG. 12 shows a result of measurement of reflection loss of two kinds of nip-ZnSSe photodiodes. The abscissa is wavelengths (nm) of incidence light from 300 nm to 500 nm. The ordinate is reflection loss (%). Since futuristic DVD devices based upon GaN-LDs would utilize readout light of a wavelength of 400 nm, reflection loss is measured in a 200 nm wide range at 400 nm±100 nm. A solid line denotes Embodiment 2 (with AR). A dotted line shows Embodiment 1 (without AR). Non AR Embodiment 1 shows reflection loss of about 23% to 25% for 300 nm to 450 nm. The reflection loss vibrates from 460 nm to 500 nm. The vibration is induced by interference.

AR coated Embodiment 2 shows a maximum reflection loss of 28% at 300 nm. Reflection loss linearly decreases as the wavelength increases. The decrease is an advantage of forming the antireflection film on the top aperture. The reflection loss is smaller than AR-less Embodiment 1 in a wide range from 340 nm to 500 nm. At 400 nm of the assumed DVD readout wavelength, the reflection loss is 11%. The AR film reduces reflection loss at 400 nm by about 10%. At 460 nm, the reflection loss takes a minimum value of 2%. Reduction of the reflection loss exhibits a conspicuous advantage of the antireflection film.

Figure 13:
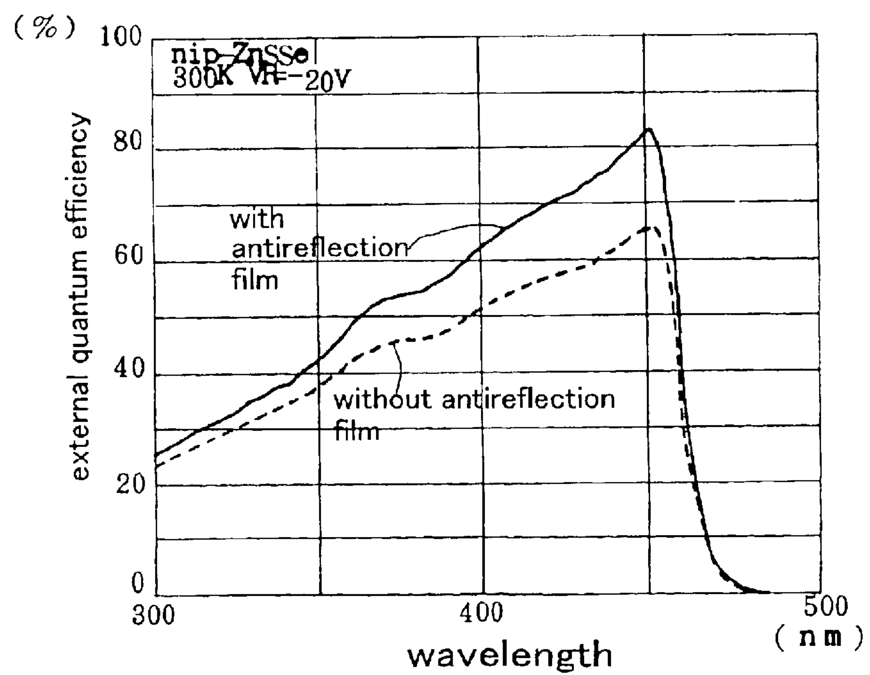
FIG. 13 is a graph denoting external quantum efficiency of the ZnSSe-PDs of Embodiment 1 without an antireflection film (AR film) and Embodiment 2 with an antireflection film as a function of wavelengths of light. The abscissa is a wavelength (nm). The ordinate is external quantum efficiency (%). Embodiment 2 having an antireflection film shows quantum efficiency higher than Embodiment 1 without AR film.

FIG. 13 is a result of measurement of external quantum efficiencies of the nip-ZnSSe photodiodes (PDs) of Embodiments 1 and 2. A solid line denotes Embodiment 2 with an antireflection film. A dotted line designates Embodiment 1 without an antireflection film. External quantum efficiency falls linearly in proportion to a decrease of wavelengths between 450 nm and 300 nm. The decline is caused by an increase of absorption by a window layer (top ZnSSe). Longer wavelengths are less subject to absorption. Embodiment 2 with an antireflection film obtains 83% external quantum efficiency at 450 nm. This is an excellent property. Embodiment 1 without AR film shows 66% of external quantum efficiency at 450 nm. The difference derives from difference of addition of an AR film which decreases absorption loss.

Figure 14:
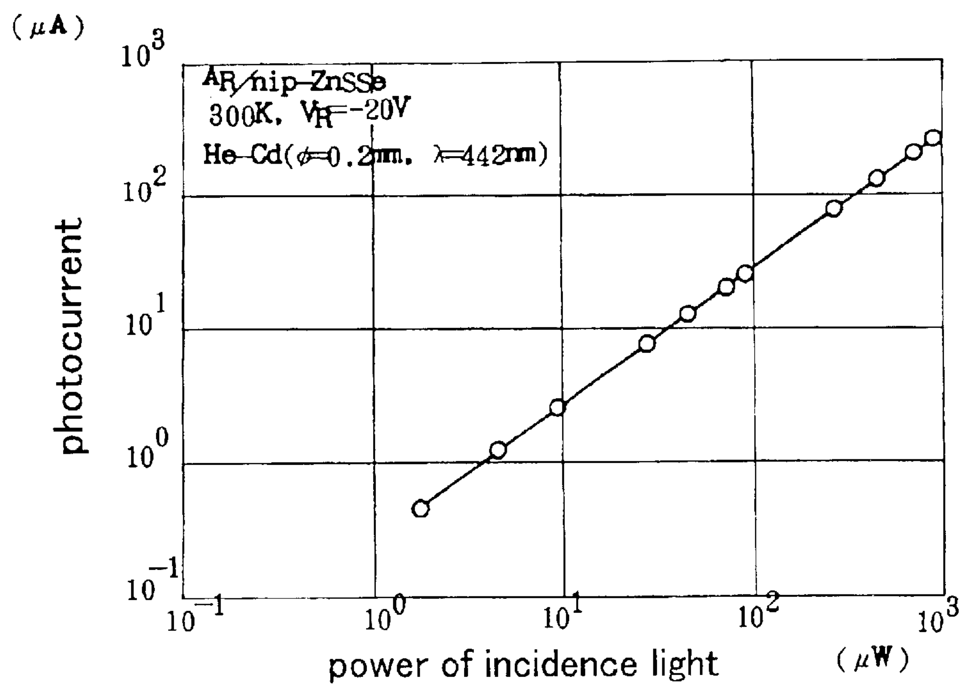
FIG. 14 is a graph showing photocurrents of the ZnSSe-PD of Embodiment 2 as a function of incidence light power. The ordinate is photocurrents ($\mu$A). The abscissa is incidence light power ($\mu$W).

FIG. 14 shows a result of measurement of photocurrents of the nip-ZnSSe-PDs of Embodiment 2 (with AR coating) as a function of the power (μW) of incidence light. The nip-PD is reverse biased by $V_R$=−20 V. The photocurrent is measured at 300K. The light source is a He—Cd laser emitting a beam of a 0.2 mm diameter of a 442 nm wavelength. The photocurrent linearly increases in proportion to the incidence light power in Embodiment 2.

Figure 15:
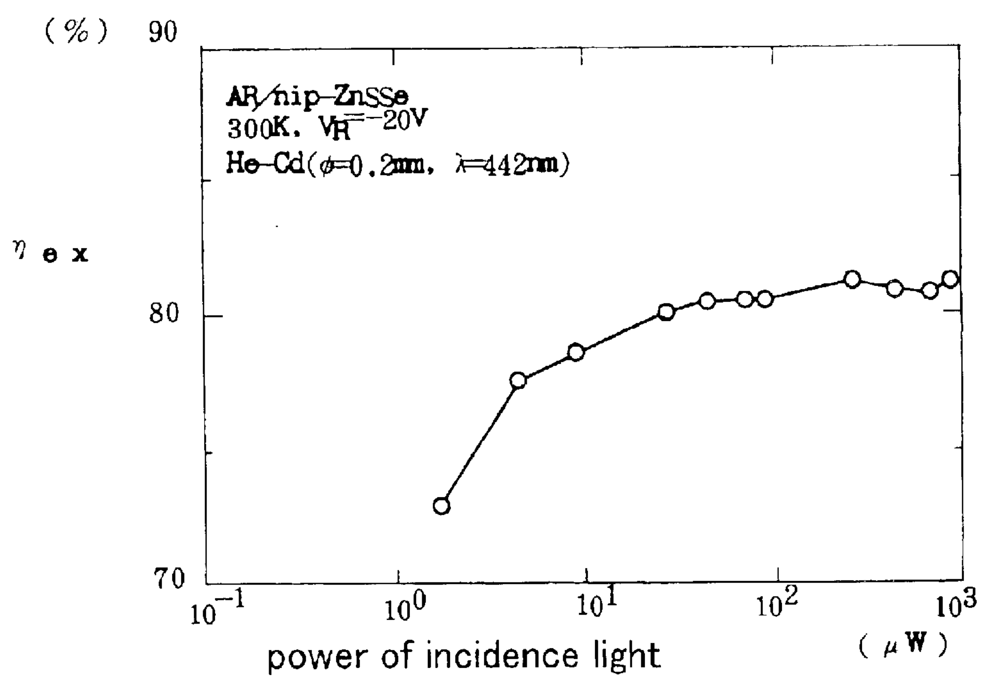
FIG. 15 is a graph of quantum efficiencies $\eta_{ex}$ of the ZnSSe-PD of Embodiment 2 measured at 300K by changing incidence light power. The ordinate is quantum efficiency $\eta_{ex}$(%). The abscissa is incidence light power ($\mu$W). 10 $\mu$W to $10^3$ $\mu$W of incidence light power lift the quantum efficiencies over eighty percent ($\eta_{ex}$>80%).

FIG. 15 shows a graph of external quantum efficiency ($\eta_{ex}$) of Embodiment 2 (AR coating) by changing input power (μW). The quantum efficiency is measured by applying a −20V reverse bias at 300K. The light source is a He—Cd laser which emits a 0.2 mm φ beam of a wavelength of 442 nm. The quantum efficiency exceeds 80% in a wide range of 10 μW to $10^3$ μof input light power. The high efficiency shows excellence of Embodiment 2.

Figure 16:
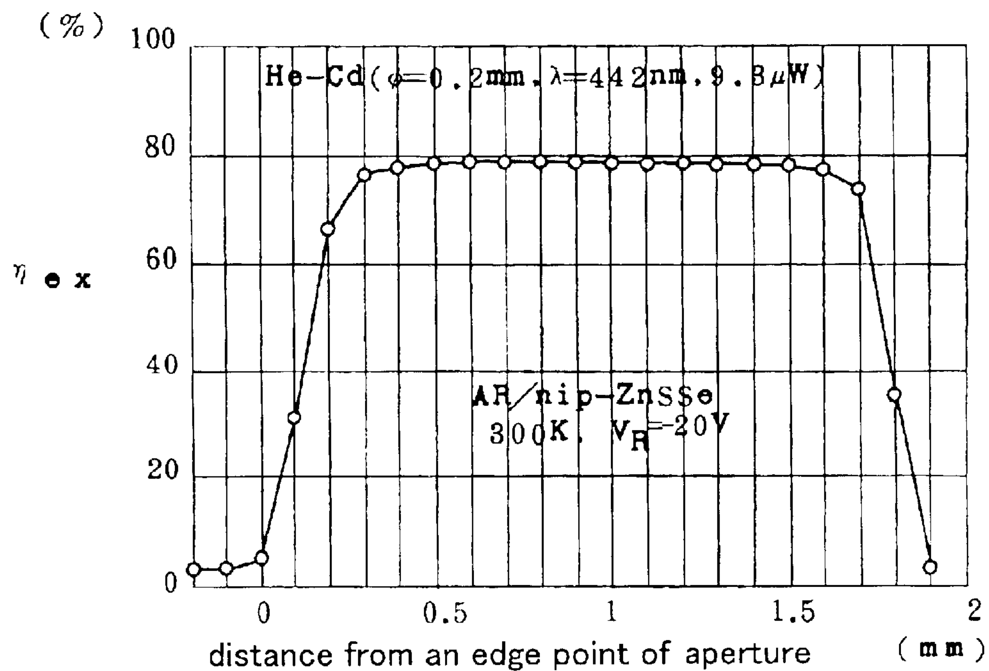
FIG. 16 is a graph of quantum efficiencies $\eta_{ex}$ of the ZnSSe-PD of Embodiment 2 measured by irradiating by a He—Cd laser beam at points along a diameter of a reception aperture of the PD. The ordinate is quantum efficiency $\eta_{ex}$(%). The abscissa is distances of the points (mm) irradiated by the He—Cd laser beam. The quantum efficiencies are enough high (about 78%) at a central region within a 0.6 mm radius around the center which is 1 mm distanced from the origin.

FIG. 16 is a graph of spatial variations of external quantum efficiency along a diameter of the ZnSSe-PD of AR-coated Embodiment 2 which is measured by irradiating spots along the diameter on the top aperture by a converged beam of a He—Cd laser. The irradiating wavelength is 442 nm. The reverse bias is −20V. The diameter of the He—Cd beam is 0.2 mm ϕ. A point of 1 mm is a center of the aperture of the PD. The external efficiency $\eta_{ex}$ is 78% within a circle of a 0.6 mm radius around the center.

Figure 17:
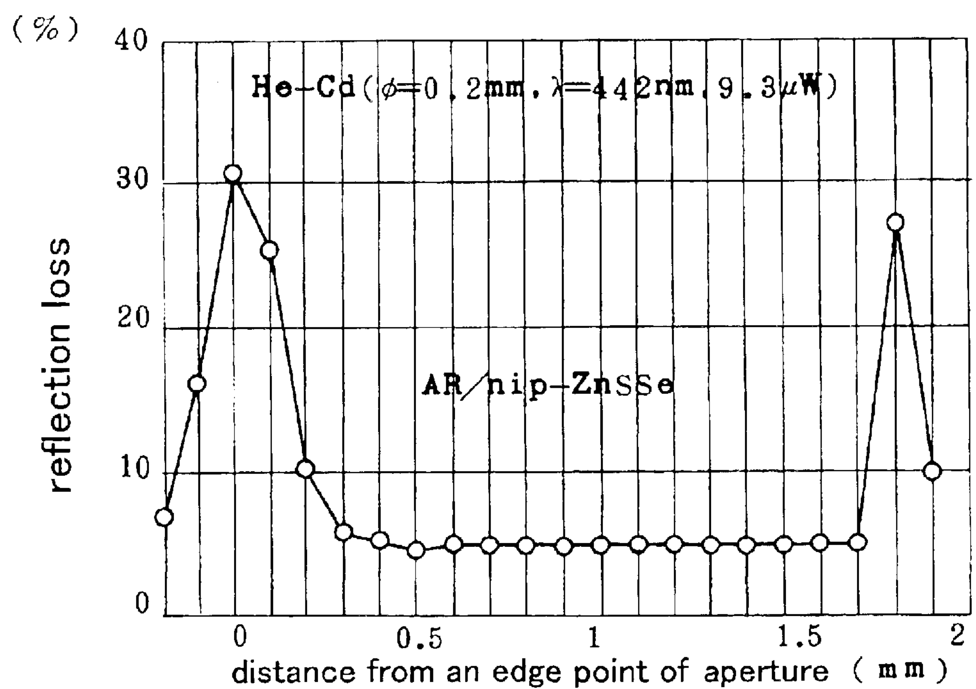
FIG. 17 is a graph of reflection loss of the ZnSSe-PD of Embodiment 2 measured by irradiating by a He—Cd laser beam at points along a diameter of the reception aperture of the PD. The ordinate is reflection loss (%). The abscissa is distances of the points (mm) irradiated by the He—Cd laser beam. The reflection loss is lower than 5% at a central region within a 0.6 mm radius around the center.
Figure 18:
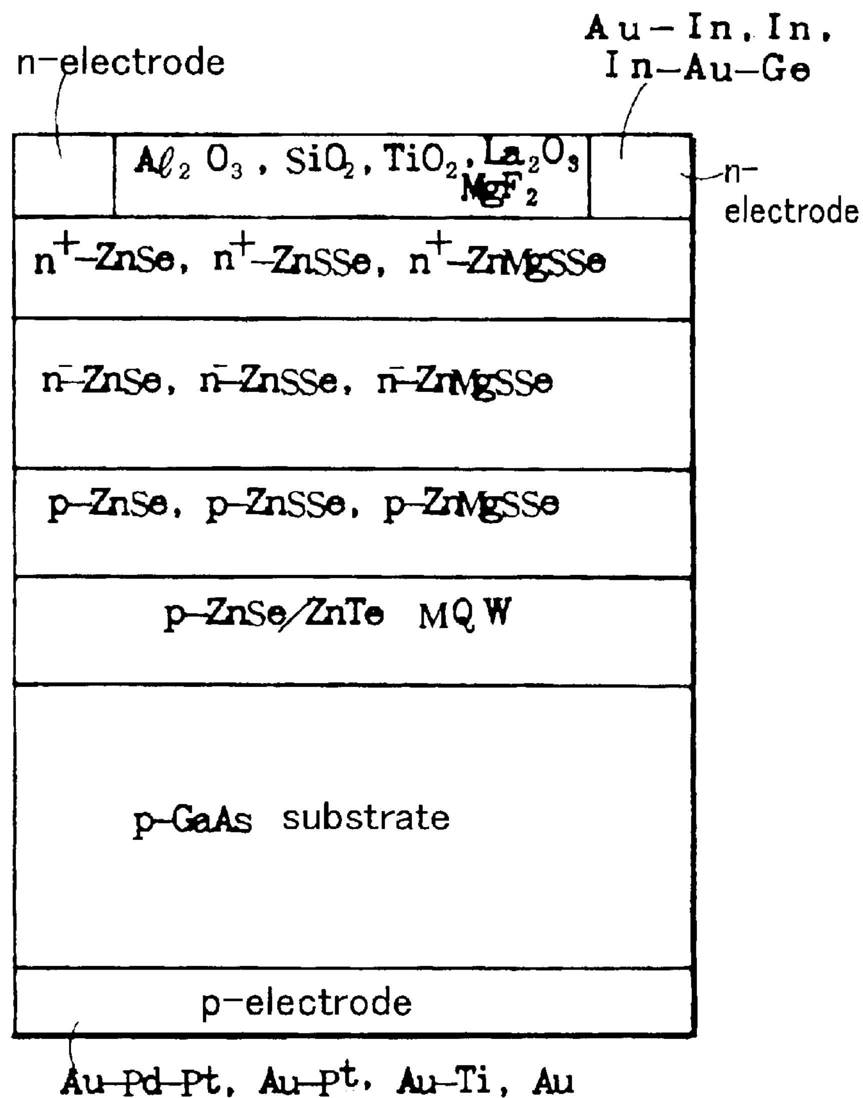
FIG. 18 is a schematic sectional view for showing a common layered structure of a ZnSSe type avalanche photodiode of the present invention.

FIG. 17 is a graph for showing spatial variations of reflection loss along a diameter on the top aperture of the ZnSSe-PD of AR-coated Embodiment 2.

Reflection loss at the center (1 mm) is 5%. The reflection loss is 5% within a circle of a 0.6 mm radius around the center. This result exhibits a superb function of the antireflection film. At points of 0 mm and 10.8 mm, reflection loss rises, which is caused by the reflection by a metal flange of the photodiode package.

[Method of Producing Photodiodes of Embodiment 1 (Common for all Embodiments)]

1. Epitaxial Growth (Production of Layers, Molecular Beam Epitaxy (MBE))

P-type GaAs substrate wafers are prepared. A p-ZnSe/ZnTe MQW, a p-ZnSe buffer layer, a p-ZnSe layer, an i-ZnSSe layer and an n-ZnSSe layer are in turn on the p-GaAs substrate wafer by an MBE method. A molecular beam epitaxy (MBE) apparatus is described by referring to FIG. 8. The MBE apparatus has a MBE chamber 92 which can be evacuated up to ultrahigh vacuum. Liquid nitrogen shrouds 93 are equipped within the MBE apparatus. A vacuum apparatus (not shown in the figure) makes vacuum in the chamber up to $10^{-8}$ Pa (about $10^{-10}$ Torr) by operation of two kinds of vacuum pumps.

Figures 8, 9:
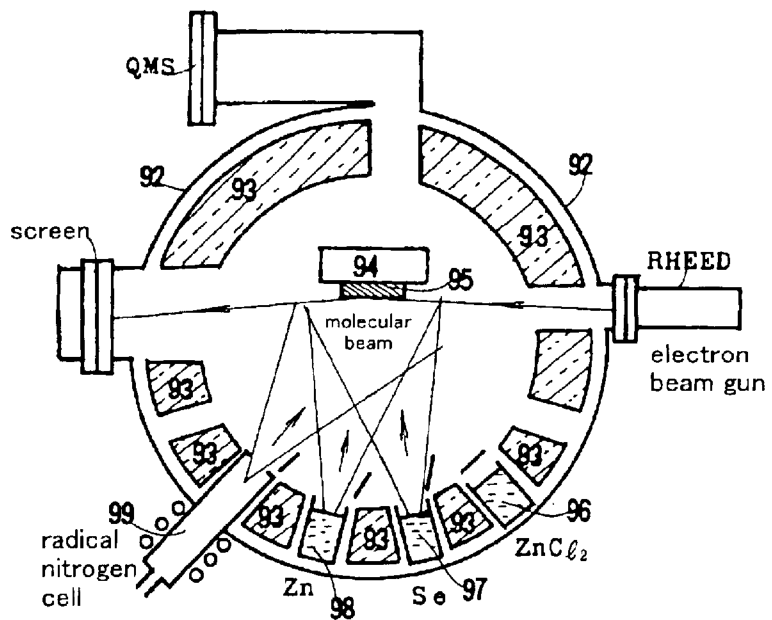
FIG. 8 is a sectional view of an molecular beam epitaxy (MBE) apparatus which the inventors employ for growing p-ZnSe/ZnTe superlattices (MQW), p-type ZnSe buffer layers, p-type ZnMgSSe layers, i-type ZnMgSSe layers and n-type ZnMgSSe layers on p-type GaAs single crystal substrates.
FIG. 9 is a sectional view of a ZnSe/ZnTe superlattice (MQW) structure of an on-p-GaAs substrate ZnSe photodiode of Embodiment 1 of the present invention.

The MBE chamber has a substrate holder 94 at a center. A p-GaAs substrate wafer 95 is fitted on the bottom of the substrate holder 94. A plurality of molecular beam cells (K-cells) 96, 97 and 98 are installed at spots on a bottom of an imaginary cone having a top point at the substrate holder 94. The K-cells have functions of heating materials, making a molecular beam and shooting the molecular beams of matrix materials or dopant materials toward the GaAs substrate 95. FIG. 8 denotes a $ZnCl_2$-cell 96, a Se-cell 97, a Zn-cell 98 and so on. These cells are necessary to produce ZnSe and ZnSSe layers.

A Cd-cell, a Mg-cell, a S-cell and a Te-cell are provided below the substrate holder 94 besides the ZnCl-cell, Se-cell, Zn-cell. These cells are utilized for producing ZnSSe or ZnMgSSe layers. The $ZnCl_2$ cell 96 is provided for doping ZnSe, ZnSSe or ZnMgSSe layers with chlorine (Cl) as an n-dopant. Cl becomes an n-type dopant by replacing group 6 elements (S or Se).

Nitrogen (N) is a p-dopant for ZnSe, ZnSSe, and ZnMgSSe. A radical cell 99 is employed for nitrogen doping. The radical cell has a coil for activating nitrogen molecules ($N_2$). Nitrogen molecules ($N_2$) are excited and activated into nitrogen radicals N* by supplying high frequency electric power to the coil. Nitrogen radicals are active. When ZnSe type compounds are doped with nitrogen radicals, the nitrogen radicals become p-dopants by replacing group 6 elements. Nitrogen had not been able to be a p-dopant until nitrogen radical cells were invented. The radical cell enables nitrogen to be a p-dopant in ZnSe type compounds. When an n-layer is grown, the object layer should be doped with chlorine by the $ZnCl_2$ cell 96. When a p-layer is grown, the layer should be doped with nitrogen by the N-radical cell 99.

The growth temperature ranges from 275° C. to 325° C. The ratio of (group VI/group II) is 1 to 5. The growing speed is 0.4 μm/H to 1 μm/H. Embodiment 1 grows a 12 nm thick multiquantum well (MQW), a 30 nm thick p-ZnSe buffer layer, a 450 nm thick p-ZnSSe layer, a 900 nm thick i-ZnSSe layer and a 44 nm thick $n^+$-ZnSSe contact layer in this turn on the p-GaAs substrate along with the above parameters. Production of the MQW will be later described.

An n-electrode of In is formed upon the $n^+$-contact layer. The metallic In n-electrode is an annular electrode or a small (dotted) round electrode having a wide aperture which allows incidence light to enter. A p-electrode of In or of Au—Zn—Pt is formed on the bottom of the p-GaAs substrate. After the electrode formation, the GaAs wafer is cut and divided into individual photodiode chips. A PD chip is upside down mounted upon a package for carrying the p-electrode in contact with a package stem. The upward directed n-electrode is connected to a lead by a wire. A photodiode is made by fitting a lens and a cap to the package.

2. ZnSe/ZnTe-MQW Interposed Between GaAs and ZnSe (FIG. 9)

FIG. 9 shows an MQW which is interposed between a p-GaAs substrate and a p-ZnSe layer. All of the layers of the MQW are made by a molecular beam epitaxy method. Structure A and Structure B are shown as examples of the MQWs in FIG. 9. There are other available sets of layered structures. The number of layers is ten for both Structure A and Structure B. Other numbers of layers (6, 8, 12, 14, . . . ) are also available. In these examples, impurity concentrations are $N_A$-$N_D$=3×$10^{17}$ $cm^{-3}$ in ZnSe and $N_A$-$N_D$=3×$10^{19}$ $cm^{-3}$ in ZnTe.

Structure A allocates a 2.1 nm thickness to all the p-ZnSe layers. The thicknesses of the p-ZnTe layers are thicker near the GaAs substrate and thinner near the ZnSe buffer. Structure A gives the five ZnTe layers thicknesses of 1.5 nm, 1.2 nm, 0.9 nm, 0.6 nm and 0.3 nm respectively from GaAs to ZnTe. An average of the ZnTe layers is 0.9 nm. A sum of the ZnTe thicknesses is 4.5 nm.

Structure B determines thicknesses of all the p-ZnSe films to be 2.1 nm. Thicknesses of the p-ZnTe films are narrower near the ZnSe interface and wider near the GaAs interface, similarly to Structure A. But, thicknesses of ZnTe films of Structure B are slightly different from Structure A. The ZnTe films have 1.8 nm, 1.2 nm, 1.2 nm, 0.6 nm and 0.6 nm respectively from GaAs to ZnTe. An average of thicknesses of ZnTe films is 1.08 nm in Structure B. A total of the ZnTe thicknesses is 5.4 nm.

Figure 10:
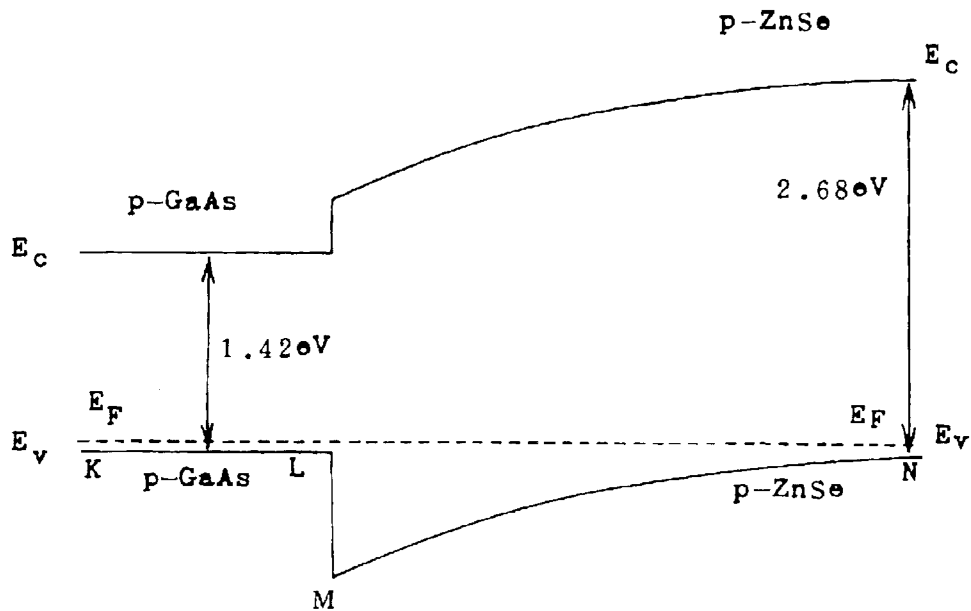
FIG. 10 is a band scheme of a direct junction of p-GaAs and p-ZnSe for showing discontinuity occurring on a valence band preventing holes from flowing from p-GaAs to p-ZnSe.

Why does this invention provide photodiodes with such an MQW of p-(ZnTe/ZnSe) between the p-GaAs substrate and the p-ZnSe layer? The reason is now clarified. FIG. 10 shows a band structure of a joint between p-GaAs and p-ZnSe without MQW (Comparison Example 1). An upper solid line curve is a conduction band Ec. A lower solid line curve is a valence band Ev. An intermediate horizontal direct dotted line is Fermi's level EF. A difference between the conduction band and the valence band is a forbidden band (or bandgap).

GaAs has a narrower bandgap of 1.42 eV. ZnSe has a wider bandgap of 2.68 eV. There is a big bandgap difference of 1.26 eV. Since GaAs and ZnSe are p-type, Fermi's level lies close to the valence band. Fermi's levels EF should be equal on both sides of the GaAs/ZnSe junction. Since GaAs and ZnSe are p-type, majority carriers are holes. Current is carried by holes in the p-region. The holes run in the valence band. Attention should be paid to the valence band. KL denotes a valence band of GaAs. MN denotes a valence band of ZnSe. A large gap LM occurs at the (GaAs/ZnSe) interface. Forward bias injects holes via a p-electrode into the p-GaAs substrate. The holes should run in the p-GaAs upward, should pass the interface and should enter the p-ZnSe. However, the barrier LM stops the holes at the interface. The holes cannot overrun the high barrier LM. This is the reason causing poor forward current property of Comparison Example 1 (without MQW).

Figure 11:
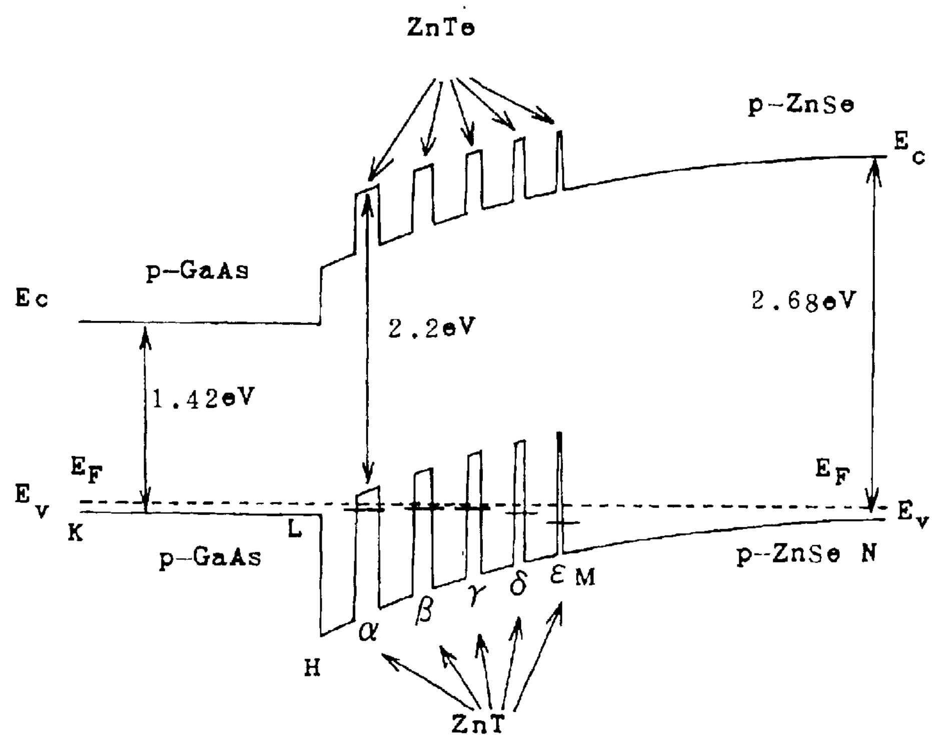
FIG. 11 is a band structure of a junction of p-GaAs and p-(ZnSe/ZnTe) superlattice (MQW; multiquantum well) for inducing tunnel conduction of holes from p-GaAs to p-ZnSe and avoiding a valence band discontinuity from suppressing a hole flow from p-GaAs to p-ZnSe.

FIG. 11 is a band diagram of a p-GaAs/MQW/ZnSe junction interposed with a p-(ZnSe/ZnTe) superlattice between p-GaAs and p-ZnSe (Embodiment 1). An upper zigzag solid line curve is a conduction band Ec. A lower zigzag solid line curve is a valence band Ev. The intermediate zigzag part corresponds to the MQW (ZnTe/ZnSe). A bandgap of GaAs is 1.42 eV. ZnSe has a bandgap of 2.68 eV. The difference of the bandgaps between ZnSe and GaAs is about 1.3 eV. The large band discontinuity prohibits holes from flowing the (GaAs/ZnSe) interface. ZnTe has a bandgap of 2.2 eV which is smaller than ZnSe. The MQW allows holes to pass the interface by tunnel conduction by making smoothly continuing hole levels in the interface. The diagram of FIG. 11 includes three kinds of bandgaps of GaAs, ZnTe and ZnSe.

A horizontal dotted line is Fermi's level which is common to all the films. Narrower ZnTe bandgaps and wider ZnSe bandgaps reciprocate in the MQW. This MQW has ten layers of ZnSe/ZnTe/ZnSe/ZnTe/ZnSe/ZnTe/ZnSe/ZnTe/ZnSe/ZnTe from GaAs to ZnSe. Thicknesses of ZnTe layers decrease from GaAs to ZnSe step by step. In the MQW, higher ZnSe films are called barriers and lower ZnTe films are called wells. As shown in FIG. 11, a bottom of the valence band of ZnSe is lower than a bottom of the valence band of ZnTe. But, a conduction band of ZnTe is higher than a conduction band of ZnSe in the ZnTe/ZnSe junction. Thus, the height of the ZnTe well is larger than the bandgap difference between ZnSe and GaAs.

At an initial end, a hole injected from GaAs to ZnSe cannot exist in the ZnSe, because the tops of valence bands are quite different between GaAs and ZnSe. The hole cannot overstep a high difference (LH). The hole, however, can pass the barrier by tunnel effect, because the ZnSe barrier is very thin (2.1 nm). Tunnel conduction allows the hole to move from the GaAs valence band to the ZnTe valence band. The ZnTe thin layer makes a narrow well in the valence band. The narrow ZnTe well makes a series of quantized levels for holes. Allowable wavefunctions are denoted by $\Psi$=b sin $\pi$(nx/d), where b is an amplitude, n is an integer and d is a width of the well. Schrödinger equation is $-(h^2/8\ m_h\ \pi)\delta^2 \Psi/\delta x^2 = E\ \Psi$, where h is Planck's constant and $m_h$ is a mass of a hole. The minimum level is given by substituting n=1. A separation of the levels is inversely-proportional to a square of the well width. The lowest level $E_{min}$ (zero-point vibration) in the first ZnTe well is denoted by $$E_{min} = -h^2/8\ m_h d^2. \quad (1)$$

The origin is the top of the valence band of ZnTe. The minus "−" sign shows a level of holes. In the representation, "d" is a width of the ZnTe well (ZnTe thinness), "$m_h$" is an effective mass of a hole and "h" is Planck's constant. Namely, the level of a hole is lowered by $E_{min}$ from the valence band top. A short line denotes the level of $E_{min}$. In the example, the MQW has ten films of ZnSe/ZnTe. Numerals 1, 2, 3, . . . , 10 are allocated to the ten films from GaAs to ZnSe. 2nd, 4th, 6th, 8th and 10th layers are ZnTe films. The thicknesses d of ZnTe films decrease stepwise from GaAs to ZnSe for enlarging the minimum hole level $E_{min} = -h^2/8\ m_h d^2$. On the contrary, the thicknesses of ZnSe films are all equal (2.1 nm). The thickness of a ZnSe film is determined for allowing holes to pass ZnSe layers by tunnel conduction.

A problem is how to design a set of ZnTe layers $\alpha$, $\beta$, $\gamma$, $\delta$ and $\epsilon$. Structure A which is shown in FIG. 9 as an example of a pertinent MQW gives thicknesses of 1.5 nm, 1.2 nm, 0.9 nm, 0.6 nm and 0.3 nm to the five ZnTe layers $\alpha$, $\beta$, $\gamma$, $\delta$ and $\epsilon$. The minimum hole levels $E_{min}$ are changed in reverse proportion to the thicknesses. The minimum hole energy $E_{min}$ falls for the ZnTe layers $\alpha$, $\beta$, $\gamma$, $\delta$ and $\epsilon$. $E_{min}$ is in proportion to $-1/1.5^2$ for ZnTe($\alpha$), $-1/1.2^2$ for ZnTe($\beta$), $-1/0.9^2$ for ZnTe($\gamma$), $-1/0.6^2$ for ZnTe($\delta$), and $-1/0.3^2$ for ZnTe ($\epsilon$). From the GaAs side to the ZnSe side, the minimum hole level $E_{min}$ becomes deeper. The valence band rises from the GaAs side to the ZnSe side. Short lines in FIG. 11 denote $E_{min}$ in the ZnTe layers $\alpha$, $\beta$, $\gamma$, $\delta$ and $\epsilon$. The $E_{min}$ levels are nearly equal to the common Fermi level $E_F$. Holes can jump from a ZnTe $E_{min}$ level to a next ZnTe $E_{min}$ level by tunnel phenomenon induced by a strong reverse bias. Repetitions of the tunnel conduction carry holes from an initial point (L) of the GaAs valence band to an end point (M) of the ZnTe valence band.

Namely, the ZnTe films are thicker on the GaAs side and thinner on the ZnSe side. The quantized hole levels lower from the GaAs side to the ZnSe side, which corresponds to rises of hole energy. The falling rate is designed to adjust to the rising curve of the valence band in a transition region from GaAs to ZnSe. The levels for holes become nearly continual. The continual levels enable holes to flow smoothly in the forward direction. What improves the forward current property from Comparison Example 1 to Embodiment 1 in FIG. 4 is the MQW of ZnTe/ZnSe. A gist of the present invention is the MQW. The MQW lowers forward resistance without inducing absorption.

Figure 19:
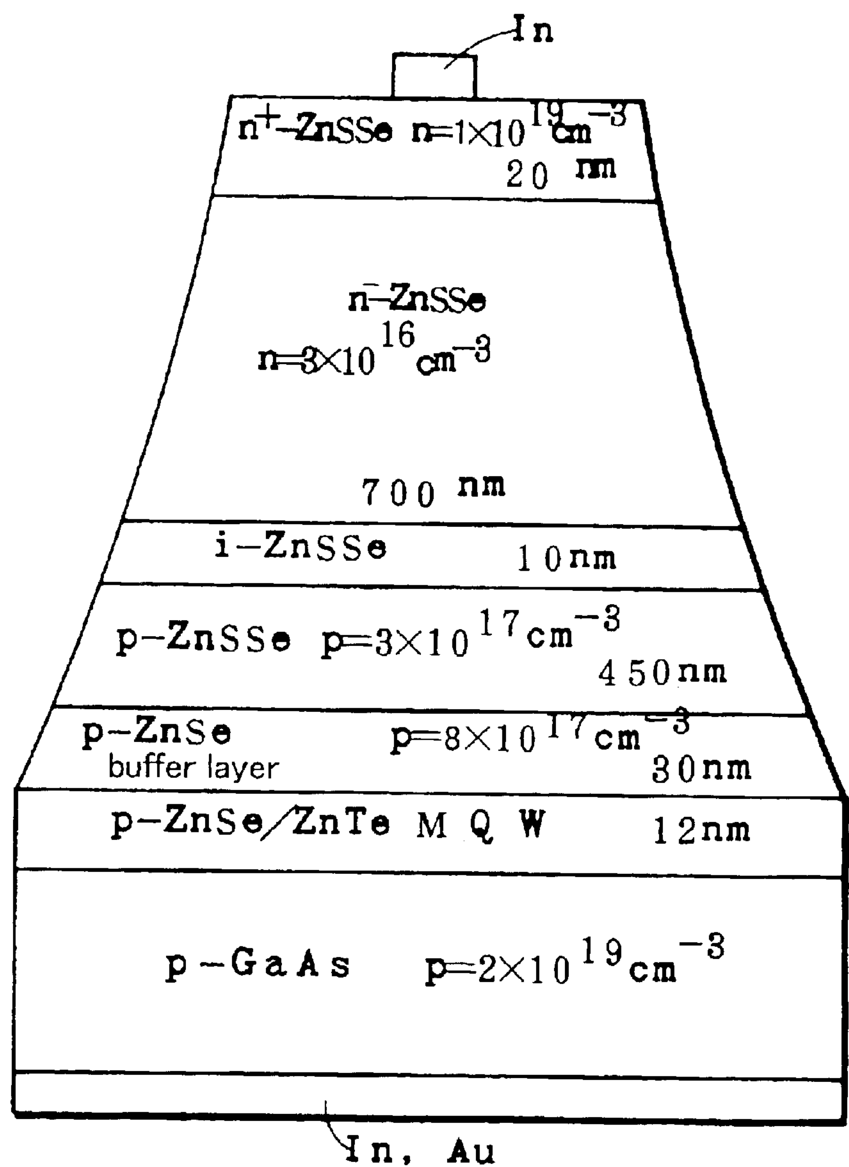
FIG. 19 is a sectional view for showing a common layered structure of a ZnSSe avalanche photodiode of Embodiment 3.

[Embodiment 3 (on-p-GaAs ZnSe Type Avalanche Photodiode (APD): FIG. 19)]

The present invention which makes a device by piling an nip-layered structure via an MQW on a p-GaAs substrate can be applied to avalanche photodiodes (APD). APDs have two types of active layered structures. One is a simple pn-junction type for active layers which joins an n-layer directly to a p-layer. The other is a pin-junction type which joins an n-layer via an i-layer to a p-layer. The present invention can be applied to both the pn- and pin-junction types. Reverse bias applied to an avalanche photodiode (APD) produces a strong electric field at a pn-junction or a pin-junction. The reverse bias is determined to be a large value slightly below a value inducing breakdown of the pn- or pin-junction. Incidence light produces pairs of electrons and holes in depletion layers. The strong electric field accelerates holes and electrons (carriers). The carries collide with atoms and excite electrons or holes from the atoms. Multiple collisions increase carriers. The increase of carriers induced by the strong electric field is called avalanche multiplication, which enable an APD to obtain a large signal gain. The above two kinds of the active layers (pn-junction or pin-junction) induce the avalanche multiplication. The pin-junction type interposing a thin i-layer is more suitable for realizing a stable APD function. The interposition of an i-layer which has a good lattice structure without impurity enables the avalanche photodiode to suppress impurity defects or other microscopic defects deriving from impurities. The intermediate i-layer has an advantage of making an excellent lattice structure, preventing strong electric field from inducing micro-plasma at the junction.

An on-p-GaAs ZnSSe avalanche photodiode having a pin-junction is produced and is examined.

[Structure of a Pin-Junction Type APD Produced Upon a p-GaAs Substrate from Top to Bottom (FIG. 19)]

| | | | |
|---|---|---|---|
| n-metallic electrode | | In dot-shaped | $\phi$ = 0.8 mm |
| $n^+$-$ZnS_ySe_{1-y}$ | y = 0.06 | n = 1 × $10^{19}$ $cm^{-3}$ | thickness 20 nm |
| $n^-$-$ZnS_ySe_{1-y}$ | y = 0.06 | n = 3 × $10^{16}$ $cm^{-3}$ | thickness 700 nm |
| i-$ZnS_ySe_{1-y}$ | y = 0.06 | n < 1 × $10^{16}$ $cm^{-3}$ | thickness 10 nm |
| p-$ZnS_ySe_{1-y}$ | y = 0.06 | p = 3 × $10^{17}$ $cm^{-3}$ | thickness 450 nm |
| p-ZnSe buffer | | p = 8 × $10^{17}$ $cm^{-3}$ | thickness 30 nm |
| p-$(ZnSe/ZnTe)^m$ | | superlattice (MQW) | m = 5 (5 pairs of ZnSe/ZnTe layers) total thickness 12 nm |
| p-GaAs substrate | | p = 2 × $10^{19}$ $cm^{-3}$ | substrate thickness 300 $\mu$m |
| p-metallic electrode | | In—Au | |

The above layered structure is produced upon a p-GaAs wafer by an MBE method. The APD wafer is cut into plenty of tiny chips of a 1 mm square. The PD chips are shaped into a mesa-shape by wet-etching, as shown in FIG. 19. An APD chip is fitted upon a mount of a package with leads. The top electrode is bonded to a lead by a wire. The APD chip is sealed by a cap with an aperture.

Figure 20:
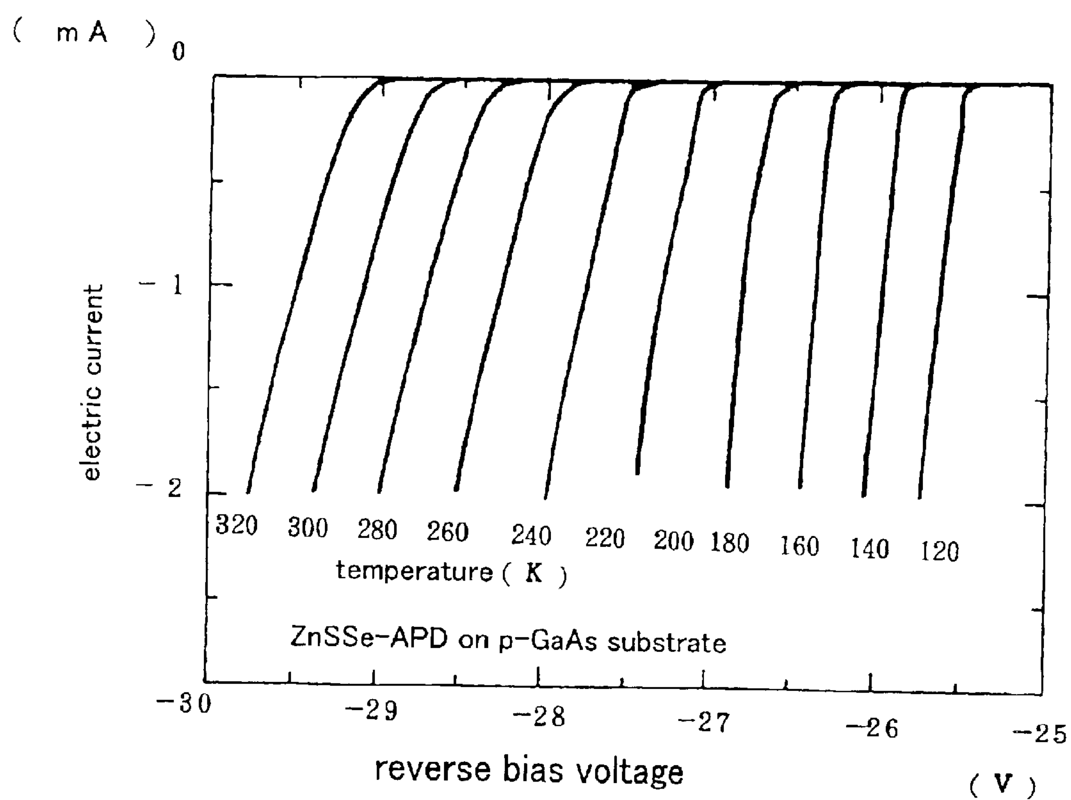
FIG. 20 is a graph for showing avalanche breakdown property of the ZnSSe avalanche photodiode of Embodiment 3 measured by varying surrounding temperatures (K).

FIG. 20 shows measured temperature variations of avalanche breakdown properties of the APD of Embodiment 3. The ordinate is electric current (mA). The abscissa is reverse bias voltage (V). Parameters are temperatures (K) which are indicated below the curves. In a high temperature range between 300K and 320K, breakdown voltages Vb are from −29V to −30 V. In a low temperature range, the breakdown voltage decreases to −25.5V. Conspicuous temperature dependence of the breakdown voltage is a result of a temperature dependence of carrier mobility. This result indicates occurrence of an intrinsic avalanche breakdown in the APD.

Figure 21:
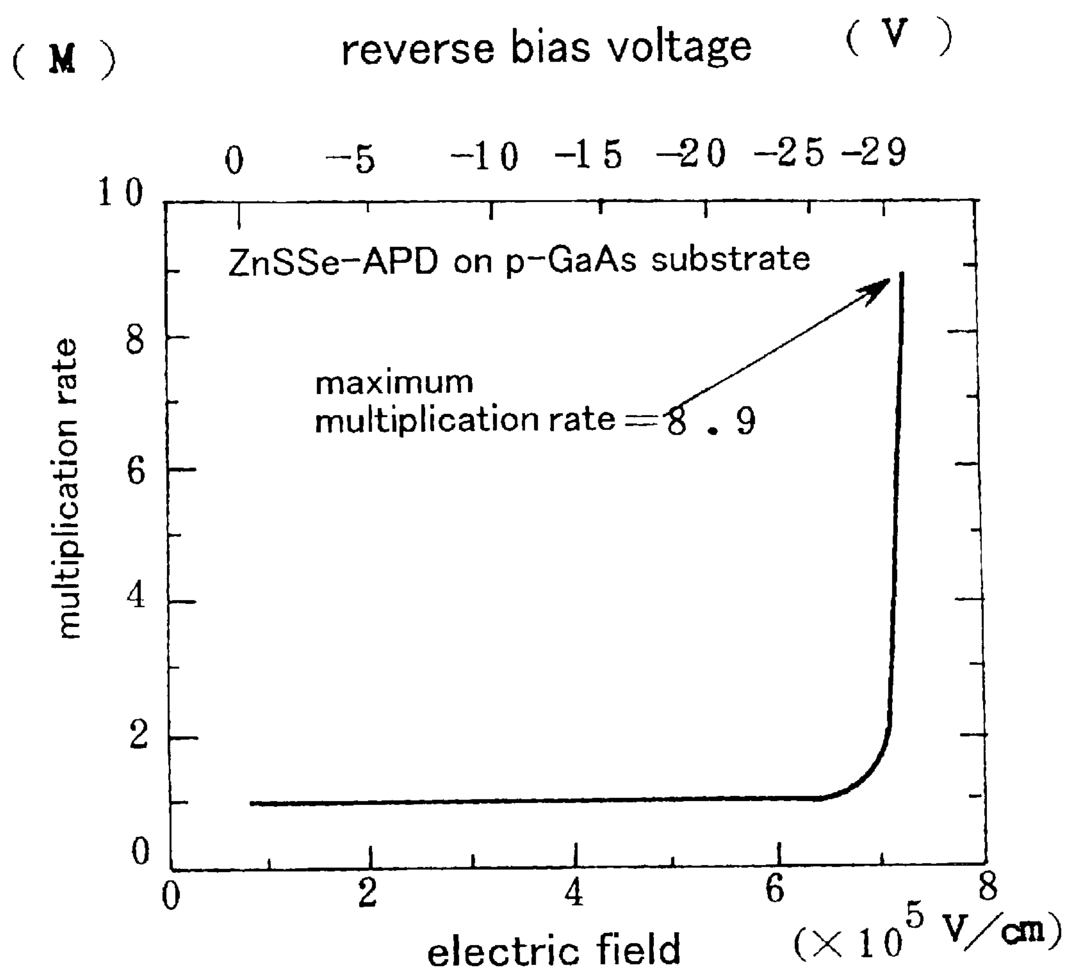
FIG. 21 is a graph of electric field dependence of multiplication rates (M) of the ZnSSe avalanche photodiode of Embodiment 3.

FIG. 21 shows variations of photocurrent gains (M) (multiplication rate) as a function of an electric field (in proportion to reverse bias) below the breakdown voltage at room temperature. The measurement of the photocurrent gains is proceeded by irradiating the APD by a He—Cd laser of a 442 nm wavelength. The APD has no antireflection film. At room temperature, the largest multiplication (gain) of 8.9 is obtained at a reverse bias of −29V. The large gain is an advantage of the APD. Another advantage is a small breakdown voltage (−29V to −30V), which is far smaller than the avalanche breakdown voltages (−50V to −80V) of silicon photodiodes or germanium photodiodes. The small breakdown voltage is effective for heightening stability and reliability of the APD of the present invention.

A preliminary aging examination of 5000 hours confirmed excellent stability of the APD of the present invention. The aging examination proved that no increment (DC-increase or abrupt hike) of dark current occurs under a reverse bias from −25V to −29.3V.

Embodiment 3 of an APD made of ZnSSe (np- or nip-) layers formed on a p-GaAs substrate exhibits high sensitivity for blue light. The present invention includes an APD which is constructed by ZnMgSSe (np- or nip-) layers formed on p-GaAs. The ZnMgSSe layered APD has a wide sensitivity range of blue, violet and ultraviolet rays. An addition of an antireflection film or a protective film on the top aperture enables this invention to produce higher sensitive, more stable and more practical avalanche photodiodes for a short wavelength range from blue to ultraviolet.

Figure 22:
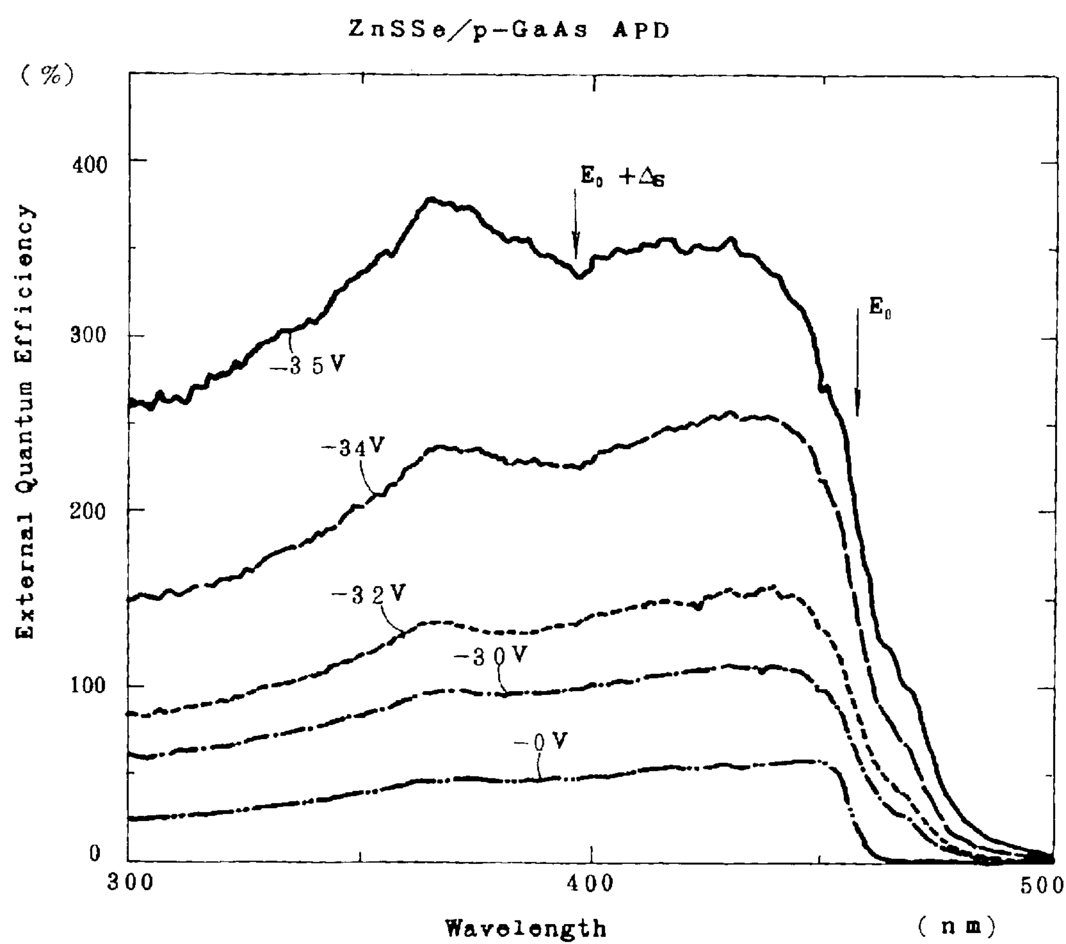
FIG. 22 is a graph showing wavelength dependence of the external quantum efficiency of the ZnSSe-APD of Embodiment 4 of the present invention. The abscissa is a wavelength of incidence light. The ordinate is external quantum efficiency (%) of the APD. Parameters 0V, −30V, −32V, −34V and −35V affixed the curves denote reverse biases.

[Embodiment 4 (on-p-GaAs ZnSe Type Avalanche Photodiode (APD): FIG. 22)]

Another on-p-GaAs ZnSSe avalanche photodiode having the following structure is produced and is examined.

[Layered Structure (from Top to Bottom)]

| | | | |
|---|---|---|---|
| n-metallic electrode | | In dot-shaped | $\phi$ = 0.8 mm |
| $n^+$-$ZnS_ySe_{1-y}$ | y = 0.06 | n = 1 × $10^{19}$ $cm^{-3}$ | thickness 10 nm |
| $n^-$-$ZnS_ySe_{1-y}$ | y = 0.06 | n = 3 × $10^{16}$ $cm^{-3}$ | thickness 700 nm |
| i-$ZnS_ySe_{1-y}$ | y = 0.06 | n < 1 × $10^{16}$ $cm^{-3}$ | thickness 10 nm |
| p-$ZnS_ySe_{1-y}$ | y = 0.06 | p = 3 × $10^{17}$ $cm^{-3}$ | thickness 450 nm |
| p-ZnSe buffer | | p = 8 × $10^{17}$ $cm^{-3}$ | thickness 30 nm |
| p-$(ZnSe/ZnTe)^m$ | | superlattice (MQW) | m = 5 (5 pairs of ZnSe/ZnTe layers) total thickness 12 nm |
| p-GaAs substrate | | p = 2 × $10^{19}$ $cm^{-3}$ | substrate thickness 300 $\mu$m |
| p-metallic electrode | | In—Au | |

The above layered structure is produced upon a p-GaAs wafer by an MBE method. The APD wafer is cut into plenty of tiny chips of a 1 mm square. The PD chips are shaped into a mesa-shape by wet-etching. An APD chip is fitted upon a mount of a package with leads. The top electrode is bonded to a lead by a wire. The APD chip is sealed by a cap with an aperture.

Embodiment 4 has a 10 nm thick top n-ZnSSe layer which is thinner than Embodiment 3. A low resistance ohmic n-electrode can be formed upon such a thick n-layer. Thinning of the top n-ZnSSe layer reduces light absorption and enhances quantum efficiency. FIG. 22 is a graph showing a result of measurement of quantum efficiency as a function of input light wavelengths at room temperature. The abscissa is a wavelength (nm) of input light. The ordinate is external quantum efficiency (%). Parameters are reverse biases of Vb=0V, −30V, −32V, −34V and −35V. An increase of the reverse bias raises external quantum efficiency. Embodiment 3 has applied reverse bias to −29V under He—Cd laser input λ=442 nm. But, Embodiment 4 applies stronger reverse bias to −35V.

"$E_0$" shows the bandgap energy of ZnSSe corresponding to a wavelength of 457 nm (λ=1239.8/Eg). Sensitivity falls for wavelengths longer than the bandgap wavelength. The APD has nearly flat sensitivity for wavelengths (from 300 nm to 450 nm) shorter than the bandgap wavelength.

External quantum efficiency is about 25% for a 0V reverse bias at a 300 nm wavelength. The quantum efficiency rises to 40% at 400 nm and to 60% at 450 nm for the 0 bias.

In the case of a reverse bias of −30V, external quantum efficiency is 60% at 300 nm, 100% at 400 nm and 110% at 450 nm.

A −32V reverse bias enhances quantum efficiency up to 80% at 300 nm, 130% at 400 nm and 140% at 450 nm.

In the case of a reverse bias of −34V, external quantum efficiency is 150% at 300 nm, 230% at 400 nm and 220% at 450 nm.

The strongest −35V reverse bias exhibits 260% at 300 nm, 330% at 400 nm and 300% at 450 nm. The breakdown voltage Vb of the present invention APD is equal to or less than 35V (Vb≧−35V).

When the reverse bias is raised, the quantum efficiency of the just-below bandgap region (457 nm) is surpassed by a shorter wavelength region of energy $E_0+\Delta_s$ which corresponds to 395 nm. The 360 nm wavelength region shows 370% of external quantum efficiency.

The result shows that the APD exceeds the pin-PD of FIG. 13 in the sensitivity for the short wavelength region near 360 nm. In the case of the pin-PD of FIG. 13, the external quantum efficiency represented by a unit of mA/W which is a quotient of dividing photocurrent (mA) by light power (W) draws a rightward rising curve which takes a maximum near the bandgap. Energy of light increase in proportion to an inverse ($1/\lambda$) of a wavelength. But, photocurrent induced by the incidence light is nearly constant. Then, the quantum efficiency rises as the wavelength increases in the range below the bandgap wavelength.

The avalanche photodiode of Embodiment 4 has an advantage of high quantum efficiency for the light of wavelengths shorter than the bandgap wavelength.

$E_0+\Delta_s$ ($\lambda$=395 nm) corresponds to the bandgap of forbidden band split by the spin-orbit interaction (LS coupling).

Blue, violet and ultraviolet rays below 457 nm are absorbed by the $n^-$-ZnMgSSe region and are converted to pairs of electrons and holes. Holes, minority carriers, are accelerated by a strong electric field formed in the $n^-$-ZnMgSSe layer. Collision of high speed holes with atoms yields new carriers. The carriers further generate new carriers. Avalanche amplification takes place. Light beams of wavelengths of 395 nm or less than 395 nm produce holes in the lower branch of the valence band slit by the LS coupling. The mass of the hole has a small effective mass, which increases a multiplication rate. The small mass holes lift the efficiency curve near the peak point $E_0+\Delta_s$ (=395 nm). The LS coupling which makes the double valence band having light mass holes has the effect of enhancing the quantum efficiency curve at 395 nm and of making a near-flat sensitivity property, which is a favorable property for sensing ultraviolet rays whose wavelengths are less than 380 nm. Such an enhancement property cannot be expected for GaN type photodiodes which are also candidates for ultraviolet detection.

The ZnMgSSe nip-PD and APD of the present invention have been described about production methods and sensitivity by referring to the embodiments. Fundamental properties of the nip-PD and APD of the present invention are as follows.

(1) A reduction of dark current under a reverse bias down to a level of half of dark current of current Si-PDs which have been the least dark current among various kinds of practical PDs.

(2) A large photovoltage (1.5V–1.7V) which is about five times as large as a photovoltage of Si-PDs.

The excellent properties derives from the fundamental structure of forming an MQW on a p-GaAs substrate and forming a ZnMgSSe nip- or np-layers on the MQW.

What is claimed is:

1. An on-p-GaAs substrate $Zn_{1-x}Mg_xS_ySe_{1-y}$ pin photodiode comprising:

- a p-GaAs single crystal substrate having a top surface and a bottom surface;
- a p-$(ZnSe/ZnTe)^m$ (m: integer denoting a number of pair layers) superlattice which is made by piling p-ZnSe thin films and p-ZnTe thin films reciprocally for changing bandgaps stepwise and is epitaxially grown directly on the top surface of the p-GaAs substrate;
- a p-$Zn_{1-x}Mg_xS_ySe_{1-y}$ ($0\leqq x\leqq 0.8$, $0\leqq y\leqq 0.8$) layer epitaxially grown on the p-$(ZnSe/ZnTe)^m$ superlattice;
- an i-$Zn_{1-x}Mg_xS_ySe_{1-y}$ ($0\leqq x\leqq 0.8$, $0\leqq y\leqq 0.8$) layer epitaxially grown on the p-$Zn_{1-x}Mg_xS_ySe_{1-y}$ layer;
- an n-$Zn_{1-x}Mg_xS_ySe_{1-y}$ ($0\leqq x\leqq 0.8$, $0\leqq y\leqq 0.8$) layer epitaxially grown on the i-$Zn_{1-x}Mg_xS_ySe_{1-y}$ layer;
- a metallic n-electrode which is formed upon a part of the n-$Zn_{1-x}Mg_xS_ySe_{1-y}$ layer and has a top aperture for allowing incidence light to enter; and
- a metallic p-electrode formed on the bottom surface of the p-GaAs substrate.

2. The on-p-GaAs substrate $Zn_{1-x}Mg_xS_ySe_{1-y}$ pin photodiode according to claim 1, wherein a p-ZnSe buffer layer is interposed between the p-$(ZnSe/ZnTe)^m$ superlattice and the p-$Zn_{1-x}Mg_xS_ySe_{1-y}$ layer.

3. The on-p-GaAs substrate $Zn_{1-x}Mg_xS_ySe_{1-y}$ pin photodiode according to claim 2, wherein the i-$Zn_{1-x}Mg_xS_ySe_{1-y}$ layer has an impurity concentration less than $10^{16}$ $cm^{-3}$.

4. The on-p-GaAs substrate $Zn_{1-x}Mg_xS_ySe_{1-y}$ pin photodiode according to claim 1, wherein the n-$Zn_{1-x}Mg_xS_ySe_{1-y}$ layer has a bandgap En which is equal to or higher than a bandgap Ei of the i-$Zn_{1-x}Mg_xS_ySe_{1-y}$ layer (En$\geqq$Ei).

5. The on-p-GaAs substrate $Zn_{1-x}Mg_xS_ySe_{1-y}$ pin photodiode according to claim 4, wherein the i-$Zn_{1-x}Mg_xS_ySe_{1-y}$ layer is an i-$Zn_{1-x}Mg_xS_ySe_{1-y}$ layer including no Mg (x=0) and the n-$Zn_{1-x}Mg_xS_ySe_{1-y}$ layer is either an n-$Zn_{1-x}Mg_xS_ySe_{1-y}$ layer including Mg (x≠0) or an n-$ZnS_ySe_{1-y}$ layer including no Mg (x=0).

6. The on-p-GaAs substrate $Zn_{1-x}Mg_xS_ySe_{1-y}$ pin photodiode according to claim 4, wherein the i-$Zn_{1-x}Mg_xS_ySe_{1-y}$ layer is an i-ZnSe layer including neither Mg nor S (x=0, y=0) and the n-$Zn_{1-x}Mg_xS_ySe_{1-y}$ layer is either an n-$ZnS_ySe_{1-y}$ layer including no Mg (x=0, y≠0) or an n-ZnSe layer including neither Mg nor S (x=0, y=0).

7. The on-p-GaAs substrate $Zn_{1-x}Mg_xS_ySe_{1-y}$ pin photodiode according to claim 1, wherein the top aperture on the n-$Zn_{1-x}Mg_xS_ySe_{1-y}$ layer which receives incidence light is coated with a mask made of $Al_2O_3$, $SiO_2$, $TiO_2$, $La_2O_3$ or $MgF_2$ for antireflection and protection.

8. The on-p-GaAs substrate $Zn_{1-x}Mg_xS_ySe_{1-y}$ pin photodiode according to claim 1, wherein external quantum efficiency is more than 30% for light wavelengths between 300 nm and 450 nm.

9. The on-p-GaAs substrate $Zn_{1-x}Mg_xS_ySe_{1-y}$ pin photodiode according to claim 1, wherein external quantum efficiency is more than 40% for a light wavelength of 400 nm.

10. The on-p-GaAs substrate $Zn_{1-x}Mg_xS_ySe_{1-y}$ pin photodiode according to claim 1, wherein a dark current is less than $10^{-9}$ $A/cm^2$ under a reverse bias between 0 V and −20 V.

11. An on-p-GaAs substrate $Zn_{1-x}Mg_xS_ySe_{1-y}$ pin photodiode comprising:

- a p-GaAs single crystal substrate having a top surface and a bottom surface;
- a p-$(ZnSe/ZnTe)^m$ (m: integer denoting a number of pair layers) superlattice which is made by piling p-ZnSe thin films and p-ZnTe thin films reciprocally for changing bandgaps stepwise and is epitaxially grown directly on the top surface of the p-GaAs substrate;
- a p-$Zn_{1-x}Mg_xS_ySe_{1-y}$ ($0\leqq x\leqq 0.8$, $0\leqq y\leqq 0.8$) layer epitaxially grown via a p-ZnSe buffer layer upon a p-$(ZnSe/ZnTe)^m$ superlattice;
- an i-$Zn_{1-x}Mg_xS_ySe_{1-y}$ ($0\leqq x\leqq 0.8$, $0\leqq y\leqq 0.8$) layer epitaxially grown on the p-$Zn_{1-x}Mg_xS_ySe_{1-y}$ layer;
- an n-$Zn_{1-x}Mg_xS_ySe_{1-y}$ ($0\leqq x\leqq 0.8$, $0\leqq y\leqq 0.8$) layer epitaxially grown on the i-$Zn_{1-x}Mg_xS_ySe_{1-y}$ layer;
- a metallic n-electrode which is formed upon a part of the n-$Zn_{1-x}Mg_xS_ySe_{1-y}$ layer and has a top aperture for allowing incidence light to enter; and
- a metallic p-electrode formed on the bottom surface of the p-GaAs substrate.

12. The on-p-GaAs substrate $Zn_{1-x}Mg_xS_ySe_{1-y}$ pin photodiode according to claim 11, wherein a p-ZnSe buffer layer is interposed between the p-$(ZnSe/ZnTe)^m$ superlattice and the p-$Zn_{1-x}Mg_xS_ySe_{1-y}$ layer.

13. The on-p-GaAs substrate $Zn_{1-x}Mg_xS_ySe_{1-y}$ pin photodiode according to claim 12, wherein the i-$Zn_{1-x}$ $Mg_xS_ySe_{1-y}$ layer has an impurity concentration less than $10^{16}$ $cm^{-3}$.

14. The on-p-GaAs substrate $Zn_{1-x}Mg_xS_ySe_{1-y}$ pin photodiode according to claim 11, wherein the n-$Zn_{1-x}Mg_xS_ySe_{1-y}$ layer has a bandgap En which is equal to or higher than a bandgap Ei of the i-$Zn_{1-x}Mg_xS_ySe_{1-y}$ layer (En≧Ei).

15. The on-p-GaAs substrate $Zn_{1-x}Mg_xS_ySe_{1-y}$ pin photodiode according to claim 14, wherein the i-$Zn_{1-x}Mg_xS_ySe_{1-y}$ layer is an i-$ZnS_ySe_{1-y}$ layer including no Mg (x=0) and the n-$Zn_{1-x}Mg_xS_ySe_{1-y}$ layer is either an n-$Zn_{1-x}Mg_xS_ySe_{1-y}$ layer including Mg (x≠) or an n-$ZnS_ySe_{1-y}$ layer including no Mg (x=0).

16. The on-p-GaAs substrate $Zn_{1-x}Mg_xS_ySe_{1-y}$ pin photodiode according to claim 14, wherein the i-$Zn_{1-x}Mg_xS_ySe_{1-y}$ layer is an i-ZnSe layer including neither Mg nor S (x=0, y=0) and the n-$Zn_{1-x}Mg_xS_ySe_{1-y}$ layer is either an n-$ZnS_ySe_{1-y}$ layer including no Mg (x=0, y≠0) or an n-ZnSe layer including neither Mg nor S (x=0, y=0).

17. The on-p-GaAs substrate $Zn_{1-x}Mg_xS_ySe_{1-y}$ pin photodiode according to claim 11, wherein the top aperture on the n-$Zn_{1-x}Mg_xS_ySe_{1-y}$ layer which receives incidence light is coated with a mask made of $Al_2O_3$, $SiO_2$, $TiO_2$, $La_2O_3$ or $MgF_2$ for antireflection and protection.

18. The on-p-GaAs substrate $Zn_{1-x}Mg_xS_ySe_{1-y}$ pin photodiode according to claim 11, wherein external quantum efficiency is more than 30% for light wavelengths between 300 nm and 450 nm.

19. The on-p-GaAs substrate $Zn_{1-x}Mg_xS_ySe_{1-y}$ pin photodiode according to claim 11, wherein external quantum efficiency is more than 40% for a light wavelength of 400 nm.

20. The on-p-GaAs substrate $Zn_{1-x}Mg_xS_ySe_{1-y}$ pin photodiode according to claim 11, wherein a dark current is less than $10^{-9}$ $A/cm^2$ under a reverse bias between 0 V and −20 V.

* * * * *